(12) United States Patent
Wardlaw et al.

(10) Patent No.: US 11,536,758 B2
(45) Date of Patent: Dec. 27, 2022

(54) SINGLE-CAPACITOR INDUCTIVE SENSE SYSTEMS

(71) Applicant: Cirrus Logic International Semiconductor Ltd., Edinburgh (GB)

(72) Inventors: Jason L. Wardlaw, Austin, TX (US); Michael A. Kost, Cedar Park, TX (US); Anthony S. Doy, Los Gatos, CA (US); Tejasvi Das, Austin, TX (US); Siddharth Maru, Austin, TX (US); Xin Zhao, Austin, TX (US); Matthew Beardsworth, Austin, TX (US); Bruce E. Duewer, Round Rock, TX (US)

(73) Assignee: Cirrus Logic, Inc., Austin, TX (US)

( * ) Notice: Subject to any disclaimer, the term of this patent is extended or adjusted under 35 U.S.C. 154(b) by 464 days.

(21) Appl. No.: 16/517,046

(22) Filed: Jul. 19, 2019

(65) Prior Publication Data
US 2020/0271706 A1 Aug. 27, 2020

Related U.S. Application Data

(60) Provisional application No. 62/810,614, filed on Feb. 26, 2019.

(51) Int. Cl.
*G01R 27/28* (2006.01)
*G01L 9/00* (2006.01)
(Continued)

(52) U.S. Cl.
CPC ............. *G01R 27/28* (2013.01); *G01H 13/00* (2013.01); *G01L 9/007* (2013.01); *G01L 9/0072* (2013.01);
(Continued)

(58) Field of Classification Search
CPC ................ G01R 27/28; G01R 27/2611; G01R 27/2605; G01R 27/02; G01R 27/26;
(Continued)

(56) References Cited

U.S. PATENT DOCUMENTS 4,268,822 A * 5/1981 Olsen ...................... H04Q 9/08
340/7.49
4,888,554 A 12/1989 Hyde et al.
(Continued)

FOREIGN PATENT DOCUMENTS

CN 10542884 A 3/2016
CN 106471708 A 3/2017
(Continued)

OTHER PUBLICATIONS

First Office Action, China National Intellectual Property Administration, Application No. 201980022689.9, dated Jun. 2, 2021.
(Continued)

*Primary Examiner* — Amy He
(74) *Attorney, Agent, or Firm* — Jackson Walker L.L.P.

(57) ABSTRACT

A system may include an array of sensor elements, the array of sensor elements each comprising a first type of passive reactive element, a second type of passive reactive element electrically coupled to the array of sensor elements, a driver configured to drive the array of sensor elements and the second type of passive reactive element, and control circuitry configured to control enabling and disabling of individual sensor elements of the array of sensor elements to ensure no more than one of the array of sensor elements is enabled at a time such that when one of the array of sensor elements is enabled, the one of the array of sensor elements and the second type of passive reactive element together operate as a resonant sensor.

22 Claims, 14 Drawing Sheets

(51) Int. Cl.
*G01H 13/00* (2006.01)
*G01R 27/26* (2006.01)
*G01R 27/02* (2006.01)
*G06F 3/01* (2006.01)

(52) U.S. Cl.
CPC ............ *G01R 27/02* (2013.01); *G01R 27/26* (2013.01); *G01R 27/2605* (2013.01); *G01R 27/2611* (2013.01); *G06F 3/016* (2013.01)

(58) Field of Classification Search
CPC ......... G01L 9/007; G01L 9/0072; G01L 1/14; G01H 13/00; B06B 1/045; H06F 3/016
See application file for complete search history.

(56) References Cited

U.S. PATENT DOCUMENTS

| | | |
|---|---|---|
| 5,286,941 A | 2/1994 | Bel |
| 5,361,184 A | 11/1994 | El-Sharkawi et al. |
| 5,567,920 A | 10/1996 | Watanabe et al. |
| 5,661,269 A | 8/1997 | Fukuzaki et al. |
| 5,898,136 A | 4/1999 | Katsurahira |
| 6,231,520 B1 | 5/2001 | Maezawa |
| 6,380,923 B1 | 4/2002 | Fukumoto et al. |
| 6,473,708 B1 | 10/2002 | Watkins et al. |
| 7,173,410 B1 | 2/2007 | Pond |
| 7,965,276 B1 | 6/2011 | Martin et al. |
| 8,144,126 B2 | 3/2012 | Wright |
| 8,384,378 B2 | 2/2013 | Feldkamp et al. |
| 8,421,446 B2 | 4/2013 | Straubinger et al. |
| 8,674,950 B2 | 3/2014 | Olson |
| 8,970,230 B2 | 3/2015 | Narayanasamy et al. |
| 9,070,856 B1 | 6/2015 | Rose et al. |
| 9,164,605 B1 | 10/2015 | Pirogov et al. |
| 9,707,502 B1 | 7/2017 | Bonifas et al. |
| 10,168,855 B2 | 1/2019 | Baughman et al. |
| 10,372,328 B2 | 8/2019 | Zhai |
| 10,571,307 B2 | 2/2020 | Acker |
| 10,599,247 B2 | 3/2020 | Winokur et al. |
| 10,624,691 B2 | 4/2020 | Wiender et al. |
| 10,642,435 B2 | 5/2020 | Maru et al. |
| 10,726,715 B2 | 7/2020 | Hwang et al. |
| 10,908,200 B2 | 2/2021 | You et al. |
| 10,921,159 B1 | 2/2021 | Das et al. |
| 10,935,620 B2 | 3/2021 | Das et al. |
| 10,942,610 B2 | 3/2021 | Maru et al. |
| 10,948,313 B2 | 3/2021 | Kost et al. |
| 11,079,874 B2 | 8/2021 | Lapointe et al. |
| 11,294,503 B2 | 4/2022 | Westerman |
| 2001/0045941 A1 | 11/2001 | Rosenberg et al. |
| 2003/0038624 A1 | 2/2003 | Hilliard et al. |
| 2005/0192727 A1 | 9/2005 | Shostak et al. |
| 2005/0258826 A1 | 11/2005 | Kano et al. |
| 2005/0283330 A1 | 12/2005 | Laraia et al. |
| 2006/0025897 A1 | 2/2006 | Shostak et al. |
| 2006/0293864 A1 | 12/2006 | Soss |
| 2007/0047634 A1 | 3/2007 | Kang et al. |
| 2007/0198926 A1 | 8/2007 | Joguet et al. |
| 2007/0268265 A1 | 11/2007 | XiaoPing |
| 2007/0296593 A1 | 12/2007 | Hall et al. |
| 2007/0296709 A1 | 12/2007 | GuangHai |
| 2008/0007534 A1 | 1/2008 | Peng et al. |
| 2008/0024456 A1 | 1/2008 | Peng et al. |
| 2008/0088594 A1 | 4/2008 | Liu et al. |
| 2008/0088595 A1 | 4/2008 | Liu et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158185 A1 | 7/2008 | Westerman |
| 2008/0312857 A1 | 12/2008 | Sequine |
| 2009/0008161 A1 | 1/2009 | Jones et al. |
| 2009/0009195 A1 | 1/2009 | Seguine |
| 2009/0058430 A1 | 3/2009 | Zhu |
| 2009/0140728 A1 | 6/2009 | Rollins et al. |
| 2009/0278685 A1 | 11/2009 | Potyrailo et al. |
| 2009/0302868 A1 | 12/2009 | Feucht et al. |
| 2009/0308155 A1 | 12/2009 | Zhang |
| 2010/0019777 A1 | 1/2010 | Balslink |
| 2010/0045360 A1 | 2/2010 | Howard et al. |
| 2010/0153845 A1 | 6/2010 | Gregorio et al. |
| 2010/0211902 A1 | 8/2010 | Unsworth et al. |
| 2010/0231239 A1 | 9/2010 | Tateishi et al. |
| 2010/0238121 A1 | 9/2010 | Ely |
| 2010/0328249 A1 | 12/2010 | Ningrat et al. |
| 2011/0005090 A1 | 1/2011 | Lee et al. |
| 2011/0214481 A1 | 9/2011 | Kachanov et al. |
| 2011/0216311 A1 | 9/2011 | Kachanov et al. |
| 2011/0267302 A1 | 11/2011 | Fasshauer |
| 2011/0285667 A1 | 11/2011 | Poupyrev et al. |
| 2011/0291821 A1 | 12/2011 | Chung |
| 2011/0301876 A1 | 12/2011 | Yamashita |
| 2013/0018489 A1 | 1/2013 | Grunthaner et al. |
| 2013/0076374 A1 | 3/2013 | Huang |
| 2013/0106756 A1 | 5/2013 | Kono et al. |
| 2013/0106769 A1 | 5/2013 | Bakken et al. |
| 2013/0269446 A1 | 10/2013 | Fukushima et al. |
| 2014/0002113 A1 | 1/2014 | Schediwy et al. |
| 2014/0028327 A1 | 1/2014 | Potyrailo et al. |
| 2014/0137585 A1 | 5/2014 | Lu et al. |
| 2014/0225599 A1 | 8/2014 | Hess |
| 2014/0267065 A1 | 9/2014 | Levesque |
| 2015/0022174 A1 | 1/2015 | Nikitin |
| 2015/0027139 A1 | 1/2015 | Lin et al. |
| 2015/0077094 A1 | 3/2015 | Baldwin et al. |
| 2015/0084874 A1 | 3/2015 | Cheng et al. |
| 2015/0293695 A1 | 10/2015 | Schonleben et al. |
| 2015/0329199 A1 | 11/2015 | Golborne et al. |
| 2016/0018940 A1 | 1/2016 | Lo et al. |
| 2016/0048256 A1 | 2/2016 | Day |
| 2016/0117084 A1 | 4/2016 | Ording |
| 2016/0162031 A1 | 6/2016 | Westerman et al. |
| 2016/0169717 A1 | 6/2016 | Zhitomirsky |
| 2016/0179243 A1 | 6/2016 | Schwartz |
| 2016/0231874 A1 | 8/2016 | Baughman et al. |
| 2016/0241227 A1 | 8/2016 | Hirata |
| 2016/0252403 A1 | 9/2016 | Murakami |
| 2016/0305997 A1 | 10/2016 | Wiesbauer et al. |
| 2016/0357296 A1 | 12/2016 | Picciotto et al. |
| 2017/0023429 A1 | 1/2017 | Straeussnigg et al. |
| 2017/0077735 A1 | 3/2017 | Leabman |
| 2017/0093222 A1 | 3/2017 | Joye et al. |
| 2017/0097437 A1 | 4/2017 | Widmer et al. |
| 2017/0140644 A1 | 5/2017 | Hwang et al. |
| 2017/0147068 A1 | 5/2017 | Yamazaki et al. |
| 2017/0168578 A1 | 6/2017 | Tsukamoto et al. |
| 2017/0184416 A1 | 6/2017 | Kohlenberg et al. |
| 2017/0185173 A1 | 6/2017 | Ito et al. |
| 2017/0187541 A1 | 6/2017 | Sundaresan et al. |
| 2017/0237293 A1 | 8/2017 | Faraone et al. |
| 2017/0282715 A1 | 10/2017 | Fung et al. |
| 2017/0322643 A1* | 11/2017 | Eguchi ............... G06F 3/03545 |
| 2017/0328740 A1 | 11/2017 | Widmer et al. |
| 2017/0371380 A1 | 12/2017 | Oberhauser et al. |
| 2017/0371381 A1 | 12/2017 | Liu |
| 2017/0371473 A1 | 12/2017 | David et al. |
| 2018/0019722 A1 | 1/2018 | Birkbeck |
| 2018/0055448 A1 | 3/2018 | Karakaya et al. |
| 2018/0059793 A1 | 3/2018 | Hajati |
| 2018/0067601 A1 | 3/2018 | Winokur et al. |
| 2018/0088064 A1 | 3/2018 | Potyrailo et al. |
| 2018/0088702 A1 | 3/2018 | Schutzberg et al. |
| 2018/0135409 A1 | 5/2018 | Wilson et al. |
| 2018/0182212 A1 | 6/2018 | Li et al. |
| 2018/0183372 A1 | 6/2018 | Li et al. |
| 2018/0195881 A1 | 7/2018 | Acker |
| 2018/0221796 A1 | 8/2018 | Bonifas et al. |
| 2018/0229161 A1 | 8/2018 | Maki et al. |
| 2018/0231485 A1 | 8/2018 | Potyrailo et al. |
| 2018/0260049 A1 | 9/2018 | O'Lionaird et al. |
| 2018/0260050 A1 | 9/2018 | Unseld et al. |
| 2018/0321748 A1 | 11/2018 | Rao et al. |
| 2019/0179146 A1 | 6/2019 | De Nardi |
| 2019/0197218 A1 | 6/2019 | Schwartz |
| 2019/0204929 A1 | 7/2019 | Attari et al. |

(56) References Cited

U.S. PATENT DOCUMENTS

| | | |
|---|---|---|
| 2019/0235629 A1 | 8/2019 | Hu et al. |
| 2019/0286263 A1 | 9/2019 | Bagheri et al. |
| 2019/0302161 A1 | 10/2019 | You et al. |
| 2019/0302193 A1 | 10/2019 | Maru et al. |
| 2019/0302890 A1 | 10/2019 | Marijanovic et al. |
| 2019/0302922 A1 | 10/2019 | Das et al. |
| 2019/0302923 A1 | 10/2019 | Maru et al. |
| 2019/0326906 A1 | 10/2019 | Camacho Cardenas et al. |
| 2019/0339313 A1 | 11/2019 | Vandermeijden |
| 2019/0377468 A1 | 12/2019 | Micci et al. |
| 2020/0064952 A1 | 1/2020 | Siemieniec et al. |
| 2020/0064160 A1 | 2/2020 | Maru et al. |
| 2020/0133455 A1 | 4/2020 | Sepehr et al. |
| 2020/0177290 A1 | 6/2020 | Reimer et al. |
| 2020/0191761 A1 | 6/2020 | Potyrailo et al. |
| 2020/0271477 A1 | 8/2020 | Kost et al. |
| 2020/0271706 A1 | 8/2020 | Wardlaw et al. |
| 2020/0271745 A1 | 8/2020 | Das et al. |
| 2020/0272301 A1 | 8/2020 | Duewer et al. |
| 2020/0319237 A1 | 10/2020 | Maru et al. |
| 2020/0320966 A1 | 10/2020 | Clark et al. |
| 2020/0373923 A1 | 11/2020 | Walsh et al. |
| 2020/0382113 A1 | 12/2020 | Beardsworth et al. |
| 2020/0386804 A1 | 12/2020 | Das et al. |
| 2021/0064137 A1 | 3/2021 | Wopat et al. |
| 2021/0140797 A1 | 5/2021 | Kost et al. |
| 2021/0149538 A1 | 5/2021 | LaPointe et al. |
| 2021/0152174 A1 | 5/2021 | Yancey et al. |
| 2021/0361940 A1 | 11/2021 | Yeh et al. |
| 2021/0396610 A1 | 12/2021 | Li et al. |
| 2021/0404901 A1 | 12/2021 | Kost et al. |
| 2021/0405764 A1 | 12/2021 | Hellman et al. |
| 2022/0075500 A1 | 3/2022 | Chang et al. |
| 2022/0268233 A1 | 8/2022 | Kennedy et al. |

FOREIGN PATENT DOCUMENTS

| | | |
|---|---|---|
| CN | 107076623 A | 8/2017 |
| CN | 209069345 U | 7/2019 |
| DE | 4004450 A1 | 8/1991 |
| DE | 602004005672 T2 | 12/2007 |
| DE | 102015215330 A1 | 2/2017 |
| DE | 102015215331 A1 | 2/2017 |
| EP | 1697710 B1 | 4/2007 |
| EP | 2682843 A1 | 1/2014 |
| GB | 2394295 A | 4/2004 |
| GB | 2573644 A | 11/2019 |
| GB | 2586722 B | 2/2022 |
| JP | 2006246289 A | 9/2006 |
| KR | 20130052059 A | 5/2013 |
| WO | 00/33244 A2 | 6/2000 |
| WO | 20061354832 A2 | 12/2006 |
| WO | 2016032704 A1 | 3/2016 |
| WO | 2021101722 A1 | 5/2021 |
| WO | 2021101723 A1 | 5/2021 |

OTHER PUBLICATIONS

First Office Action, China National Intellectual Property Administration, Application No. 201980022693.5, dated Jul. 8, 2021.
Combined Search and Examination Report under Sections 17 and 18(3), UKIPO, Application No. GB2001341.3, dated Jun. 29, 2020.
International Search Report and Written Opinion of the International Searching Authority, International Application No. PCT/US2020/059113, dated Feb. 23, 2021.
International Search Report and Written Opinion of the International Searching Authority, International Application No. PCT/US2020/059101, dated Mar. 9, 2021.
International Search Report and Written Opinion of the International Searching Authority, International Application No. PCT/US2019/022518, dated May 24, 2019.
International Search Report and Written Opinion of the International Searching Authority, International Application No. PCT/US2019/022578, dated May 27, 2019.
International Search Report and Written Opinion of the International Searching Authority, International Application No. PCT/US2019/021838, dated May 27, 2019.
International Search Report and Written Opinion of the International Searching Authority, International Application No. PCT/US2019/045554, dated Oct. 17, 2019.
Combined Search and Examination Report, UKIPO, Application No. GB1904250.6, dated Sep. 10, 2019.
Second Office Action, China National Intellectual Property Administration, Application No. 201980022689.9, dated Oct. 27, 2021.
International Search Report and Written Opinion of the International Searching Authority, Application No. PCT/US2021/035695, dated Sep. 9, 2021.
Second Office Action, China National Intellectual Property Administration, Application No. 201980022693.5, dated Dec. 14, 2021.
Combined Search and Examination Report under Sections 17 and 18(3), UKIPO, Application No. GB2111666.0, dated Feb. 11, 2022.
Examination Report under Section 18(3), UKIPO, Application No. GB2101804.9, dated Feb. 25, 2022.
International Search Report and Written Opinion of the International Searching Authority, International Application No. PCT/US2022/012721, dated Apr. 26, 2022.
Third Office Action, China National Intellectual Property Administration, Application No. 201980022693.5, dated Apr. 13, 2022.
International Search Report and Written Opinion of the International Searching Authority, International Application No. PCT/US2022/018886, dated Jun. 10, 2022.
Combined Search and Examination Report under Sections 17 and 18(3), UKIPO, Application No. GB2201194.4, dated Jul. 1, 2022.
International Search Report and Written Opinion of the International Searching Authority, International Application No. PCT/US2022/018475, dated Aug. 2, 2022.
First Office Action, China National Intellectual Property Administration, Application No. 202010105829.3, dated Apr. 12, 2022, received by counsel Jul. 28, 2022.
Notice of Preliminary Rejection, Korean Intellectual Property Office, Application No. 10-2020-7029597, dated Jul. 29, 2022.

* cited by examiner

SINGLE-CAPACITOR INDUCTIVE SENSE SYSTEMS

RELATED APPLICATION

The present disclosure claims priority to U.S. Provisional Patent Application Ser. No. 62/810,614, filed Feb. 26, 2019, which is incorporated by reference herein in its entirety.

The present disclosure relates to U.S. Provisional Patent Application Ser. No. 16/267,079, filed Feb. 4, 2019, U.S. Provisional Patent Application Ser. No. 62/649,857, filed Mar. 29, 2018, U.S. Provisional Patent Application Ser. No. 62/721,134, filed Aug. 22, 2018, and U.S. Provisional Patent Application Ser. No. 62/740,029, filed Oct. 2, 2018, all of which are incorporated by reference herein in their entireties.

FIELD OF DISCLOSURE

The present disclosure relates in general to electronic devices with user interfaces, (e.g., mobile devices, game controllers, instrument panels for vehicles, machinery, and/or appliances, etc.), and more particularly, resonant phase sensing of resistive-inductive-capacitive sensors for use in a system for mechanical button replacement in a mobile device, and/or other suitable applications.

BACKGROUND

Many traditional mobile devices (e.g., mobile phones, personal digital assistants, video game controllers, etc.) include mechanical buttons to allow for interaction between a user of a mobile device and the mobile device itself. However, such mechanical buttons are susceptible to aging, wear, and tear that may reduce the useful life of a mobile device and/or may require significant repair if malfunction occurs. Also, the presence of mechanical buttons may render it difficult to manufacture mobile devices that are waterproof. Accordingly, mobile device manufacturers are increasingly looking to equip mobile devices with virtual buttons that act as a human-machine interface allowing for interaction between a user of a mobile device and the mobile device itself. Similarly, mobile device manufacturers are increasingly looking to equip mobile devices with other virtual interface areas (e.g., a virtual slider, interface areas of a body of the mobile device other than a touch screen, etc.). Ideally, for best user experience, such virtual interface areas should look and feel to a user as if a mechanical button or other mechanical interface were present instead of a virtual button or virtual interface area.

Presently, linear resonant actuators (LRAs) and other vibrational actuators (e.g., rotational actuators, vibrating motors, etc.) are increasingly being used in mobile devices to generate vibrational feedback in response to user interaction with human-machine interfaces of such devices. Typically, a sensor (traditionally a force or pressure sensor) detects user interaction with the device (e.g., a finger press on a virtual button of the device) and in response thereto, the linear resonant actuator may vibrate to provide feedback to the user. For example, a linear resonant actuator may vibrate in response to user interaction with the human-machine interface to mimic to the user the feel of a mechanical button click.

However, there is a need in the industry for sensors to detect user interaction with a human-machine interface, wherein such sensors provide acceptable levels of sensor sensitivity, power consumption, and size.

SUMMARY

In accordance with the teachings of the present disclosure, the disadvantages and problems associated with sensing of human-machine interface interactions in a mobile device may be reduced or eliminated.

In accordance with embodiments of the present disclosure, a system may include an array of sensor elements, the array of sensor elements each comprising a first type of passive reactive element, a second type of passive reactive element electrically coupled to the array of sensor elements, a driver configured to drive the array of sensor elements and the second type of passive reactive element, and control circuitry configured to control enabling and disabling of individual sensor elements of the array of sensor elements such that when one of the array of sensor elements is enabled, the one of the array of sensor elements and the second type of passive reactive element together operate as a resonant sensor.

In accordance with these and other embodiments of the present disclosure, a method may include driving an array of sensor elements, the array of sensor elements each comprising a first type of passive reactive element, driving a second type of passive reactive element electrically coupled to the array of sensor elements, and controlling enabling and disabling of individual sensor elements of the array of sensor elements such that when one of the array of sensor elements is enabled, the one of the array of sensor elements and the second type of passive reactive element together operate as a resonant sensor.

In accordance with these and other embodiments of the present disclosure, a system may include an array of sensor elements, a driver configured to drive the array of sensor elements, a switch network coupled between the array of sensor elements and the driver, and control circuitry for controlling the switch network to selectively enable and disable multiple switch configurations for driving by the driver.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

Figure 4A:
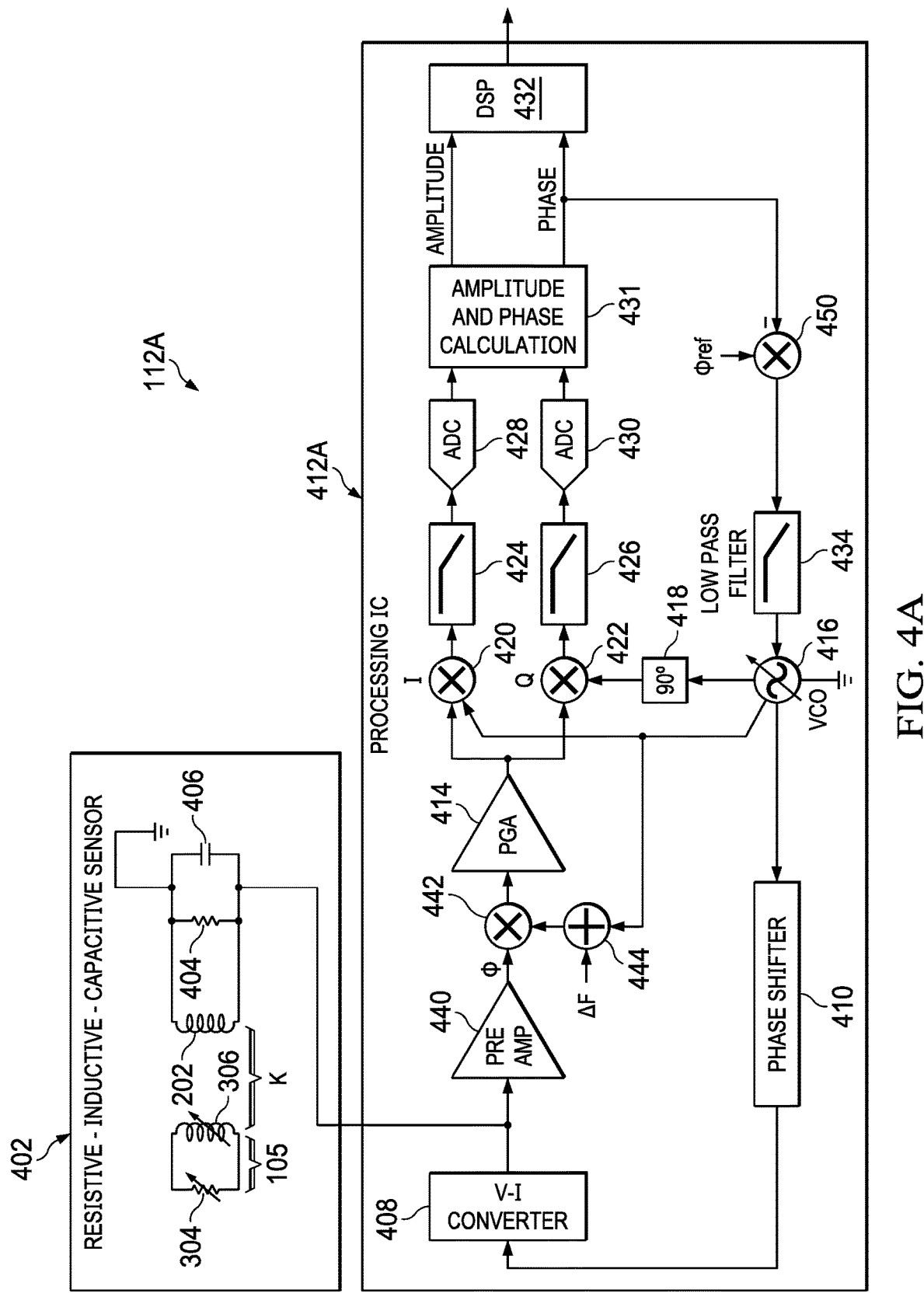
Figure 4B:
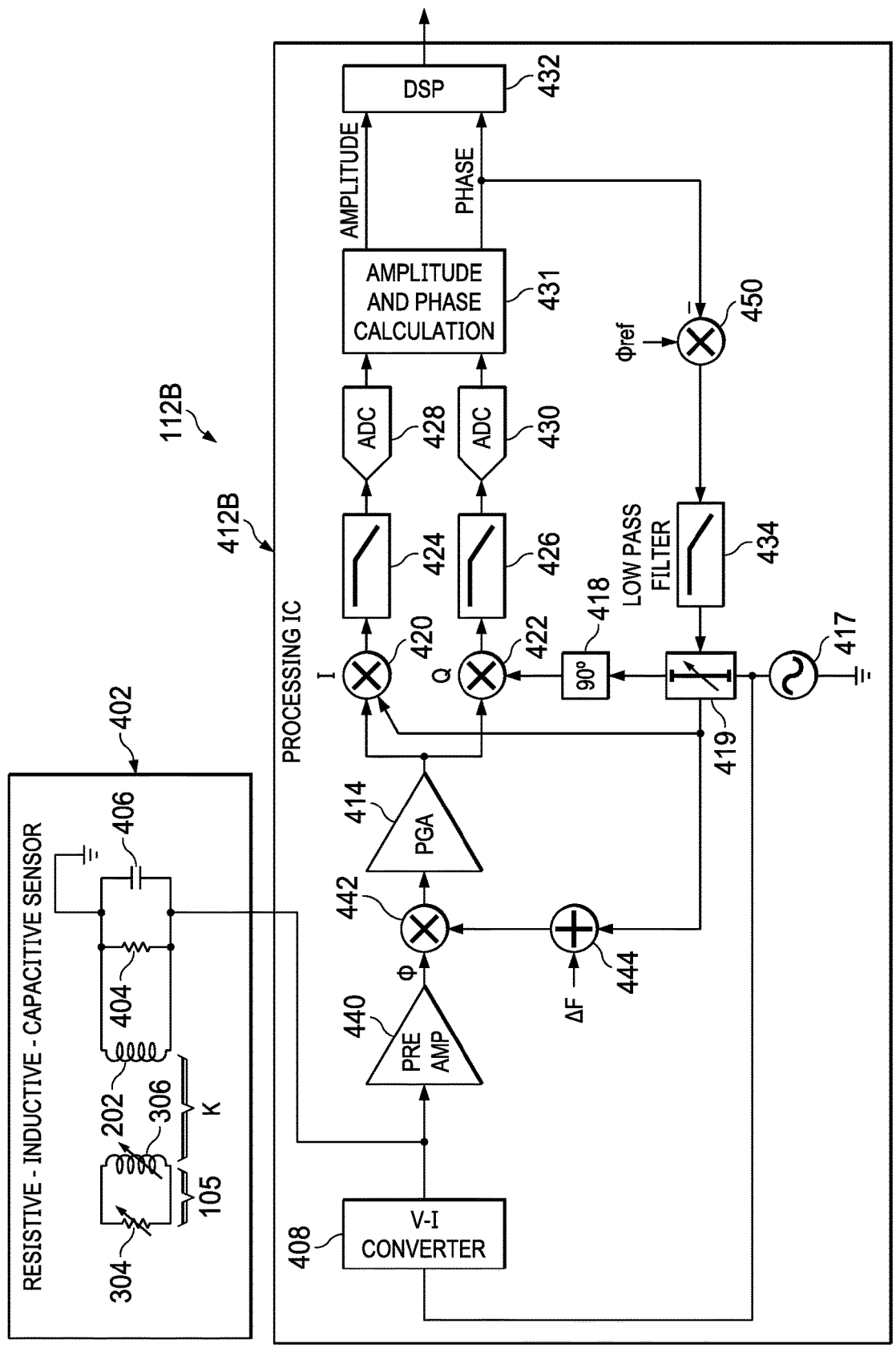
Figure 4C:
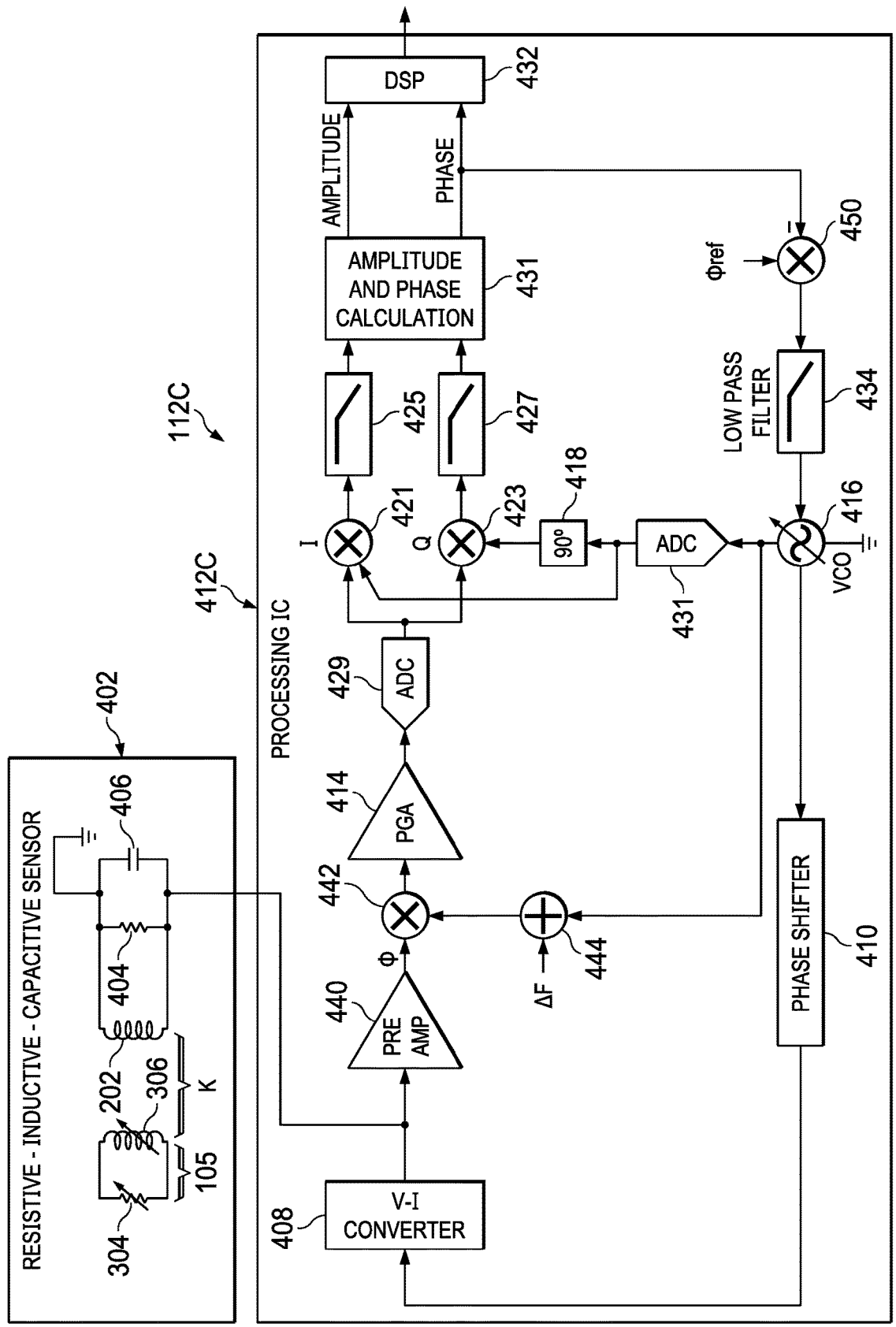
Figure 5:
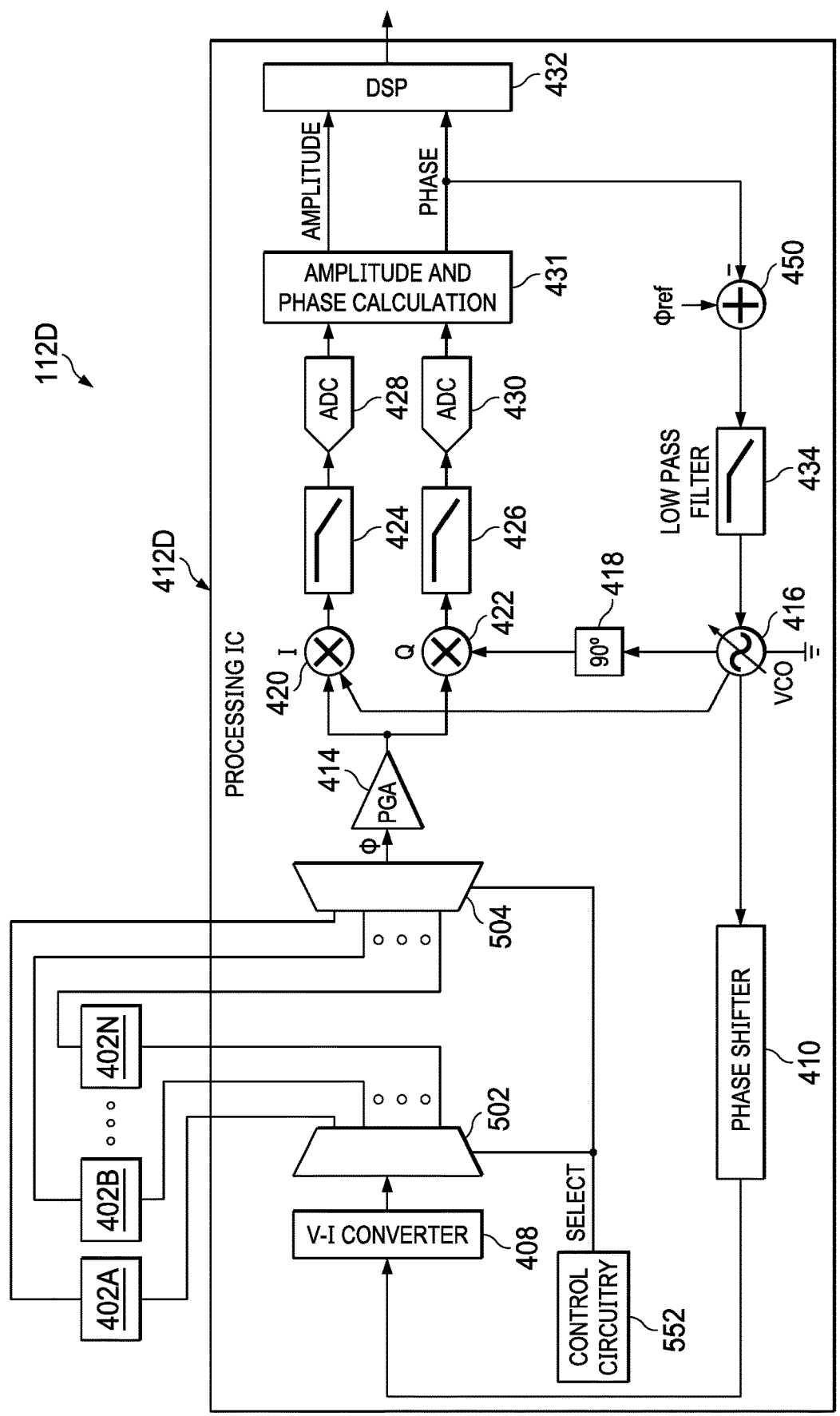
Figure 6:
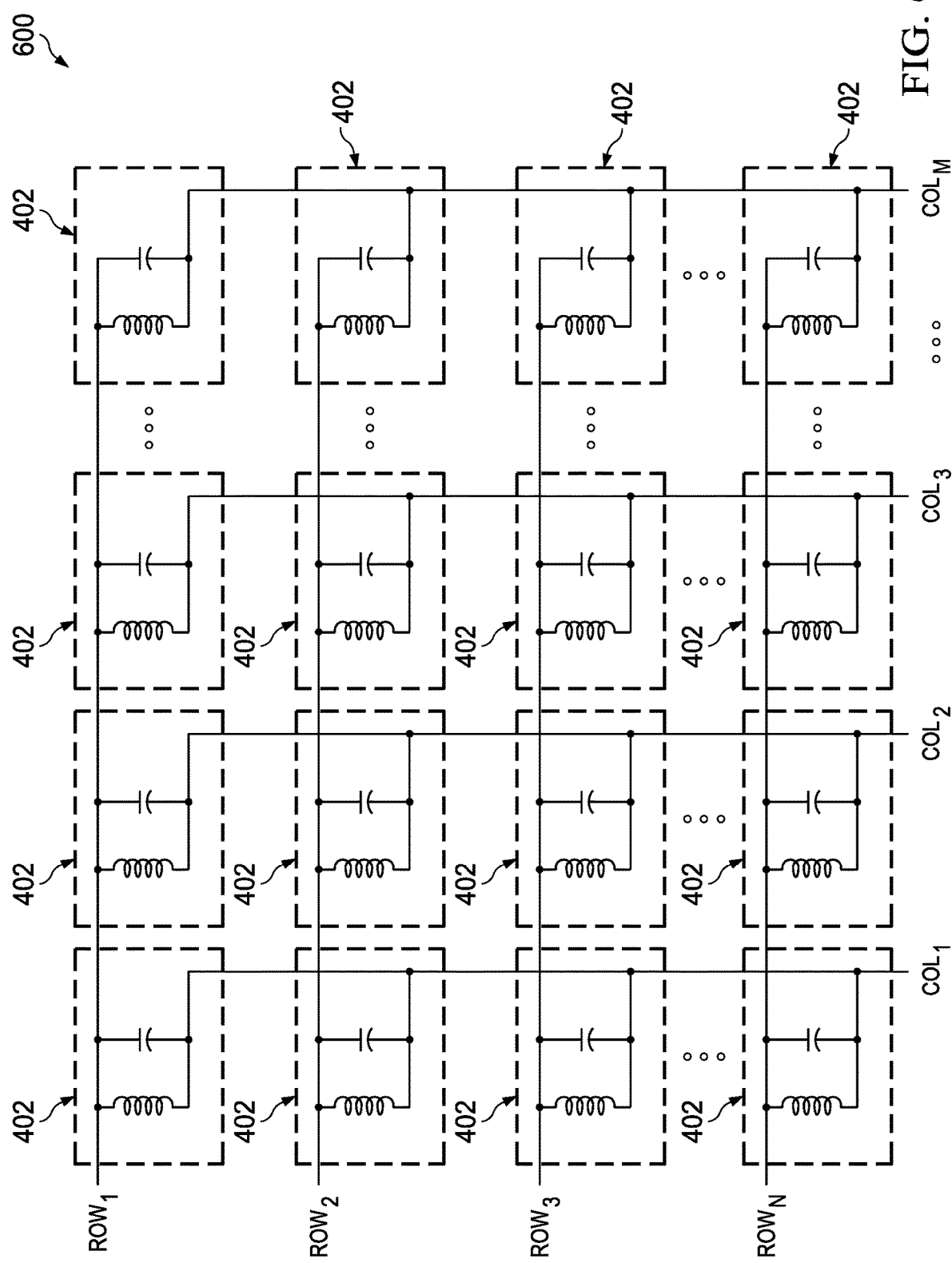
Figure 7:
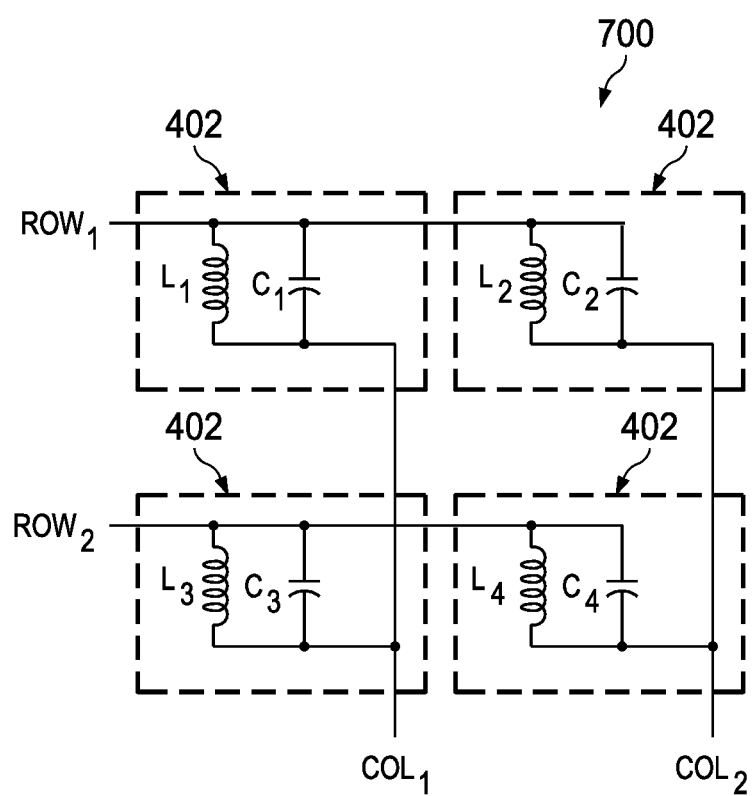
Figure 10:
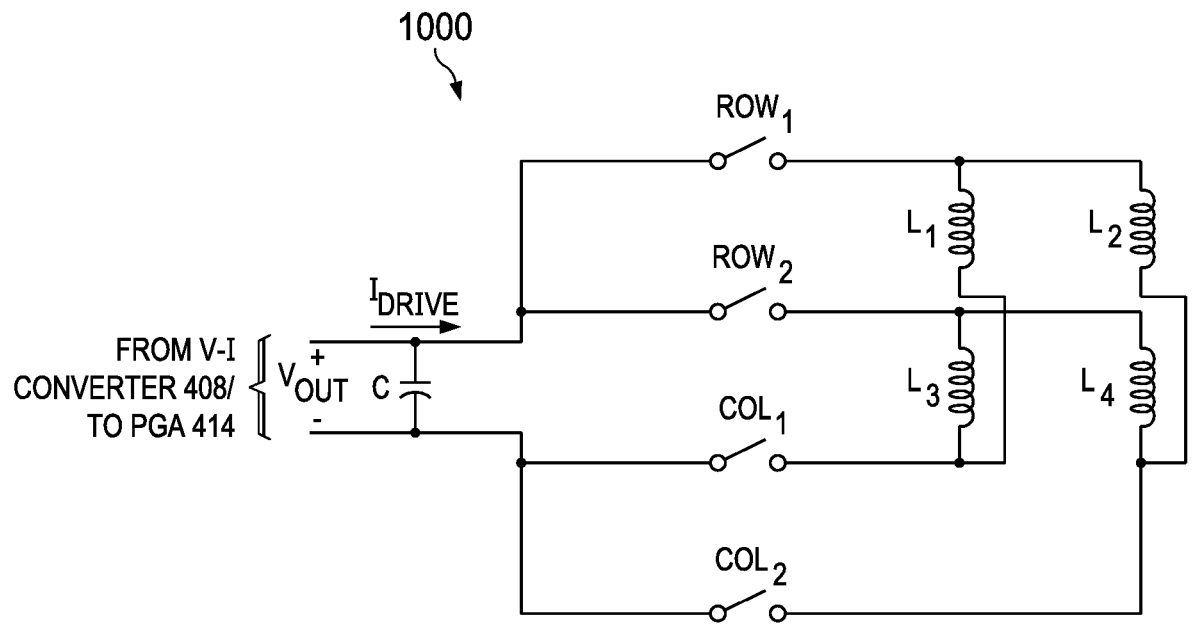
Figure 12:
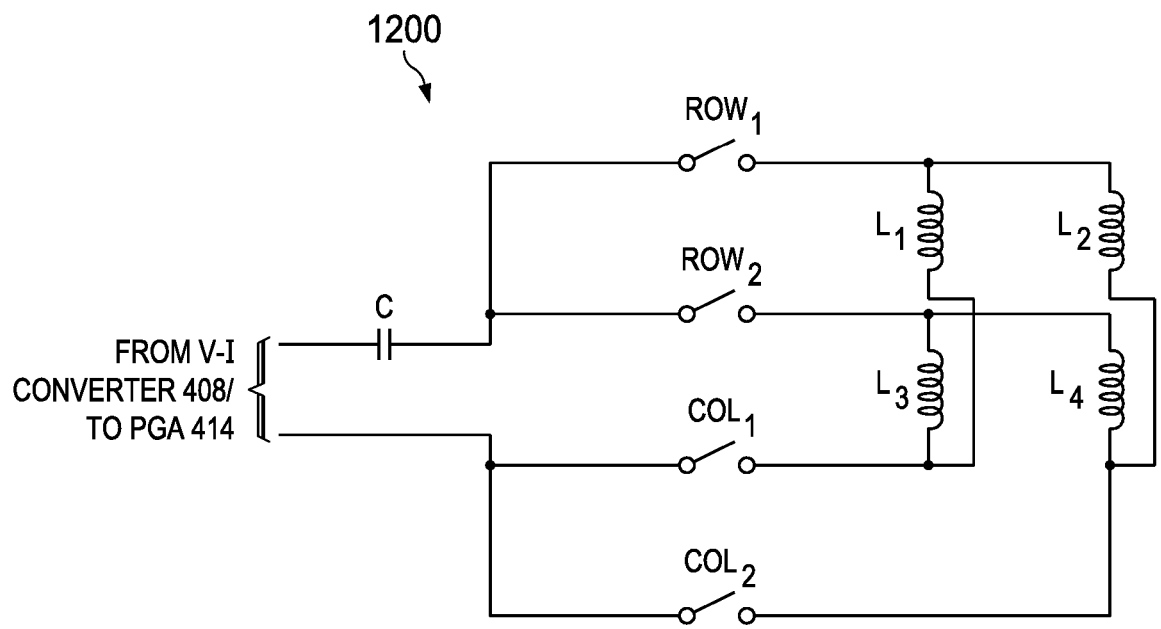
Figure 11:
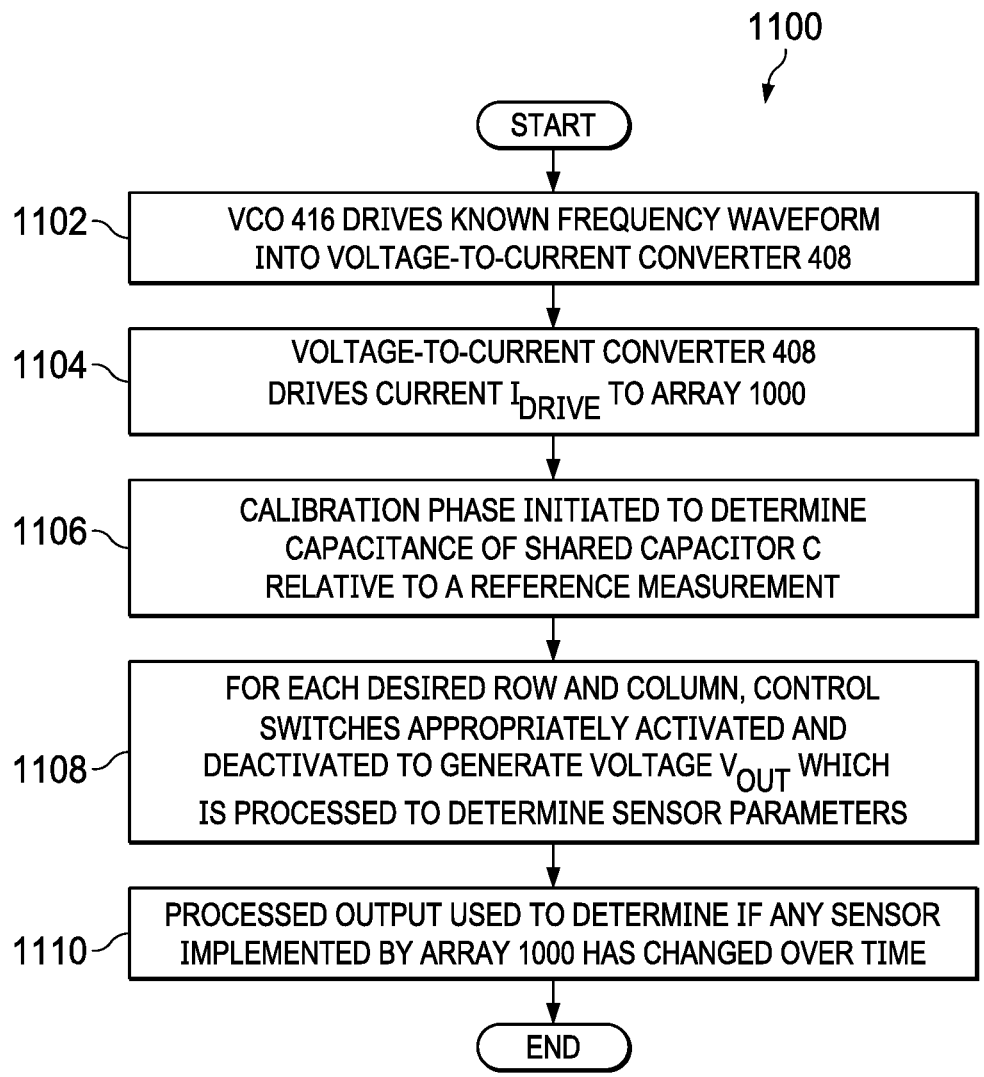
Figure 13:
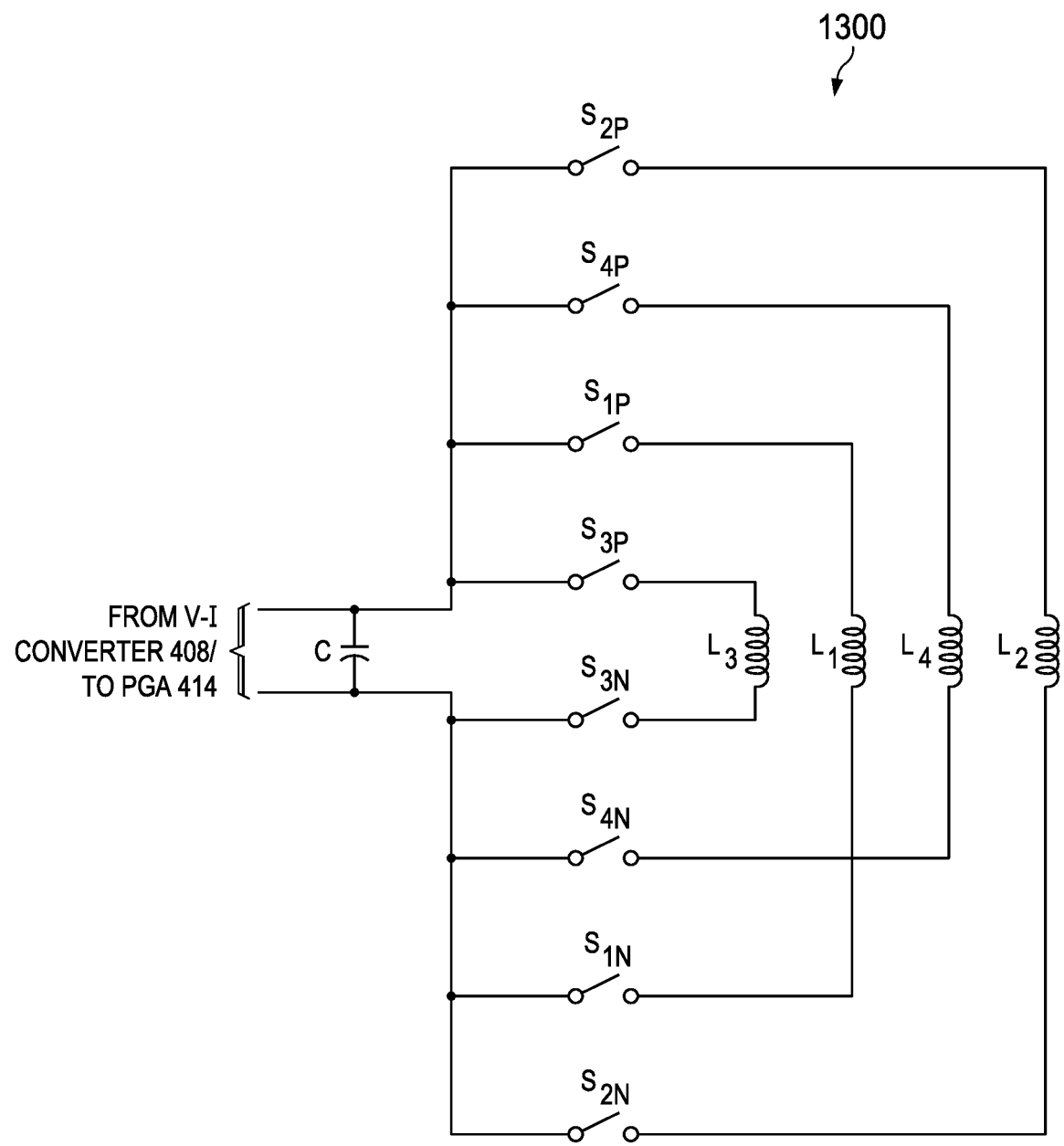
Figure 14:
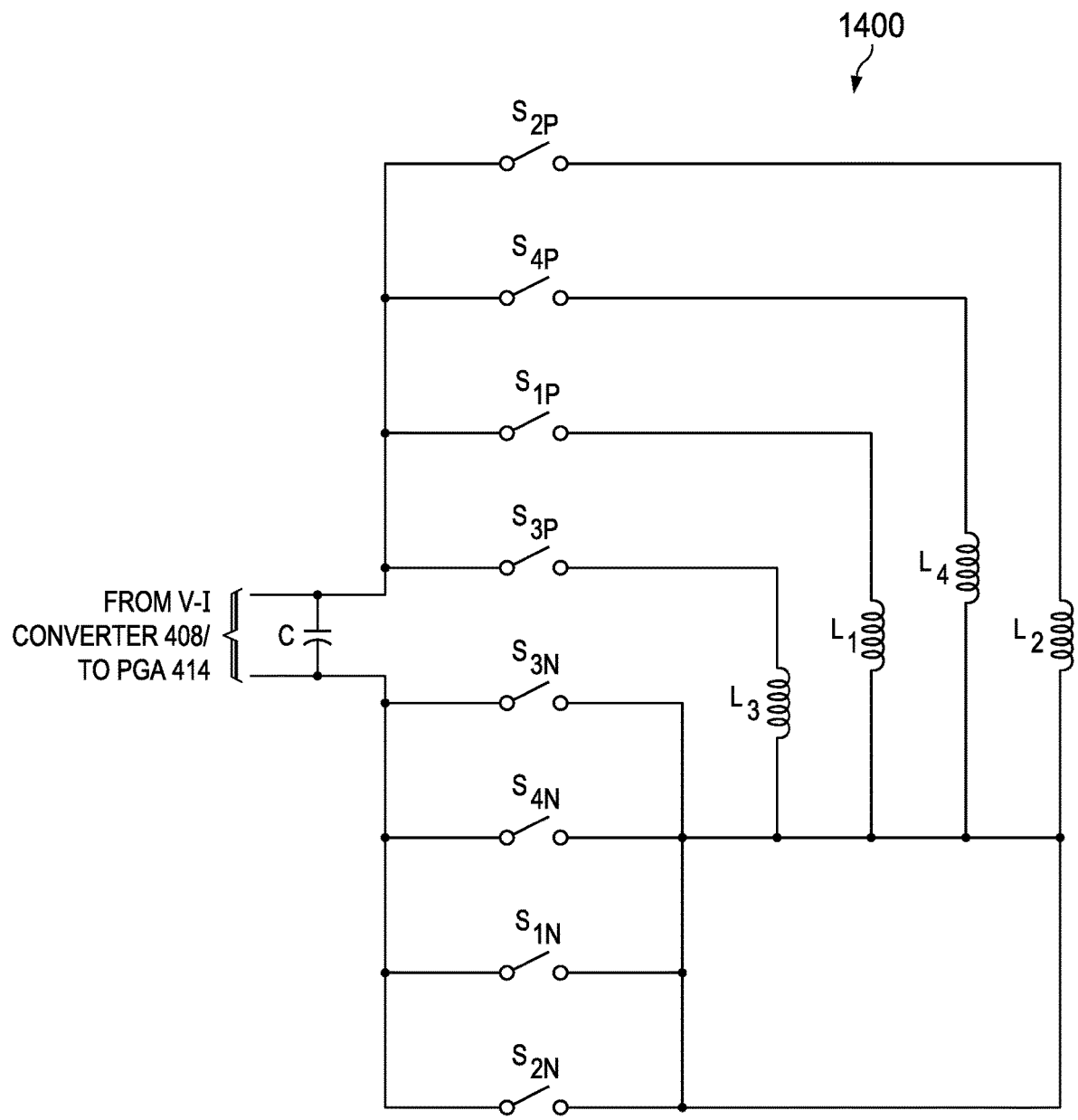
Figure 15:
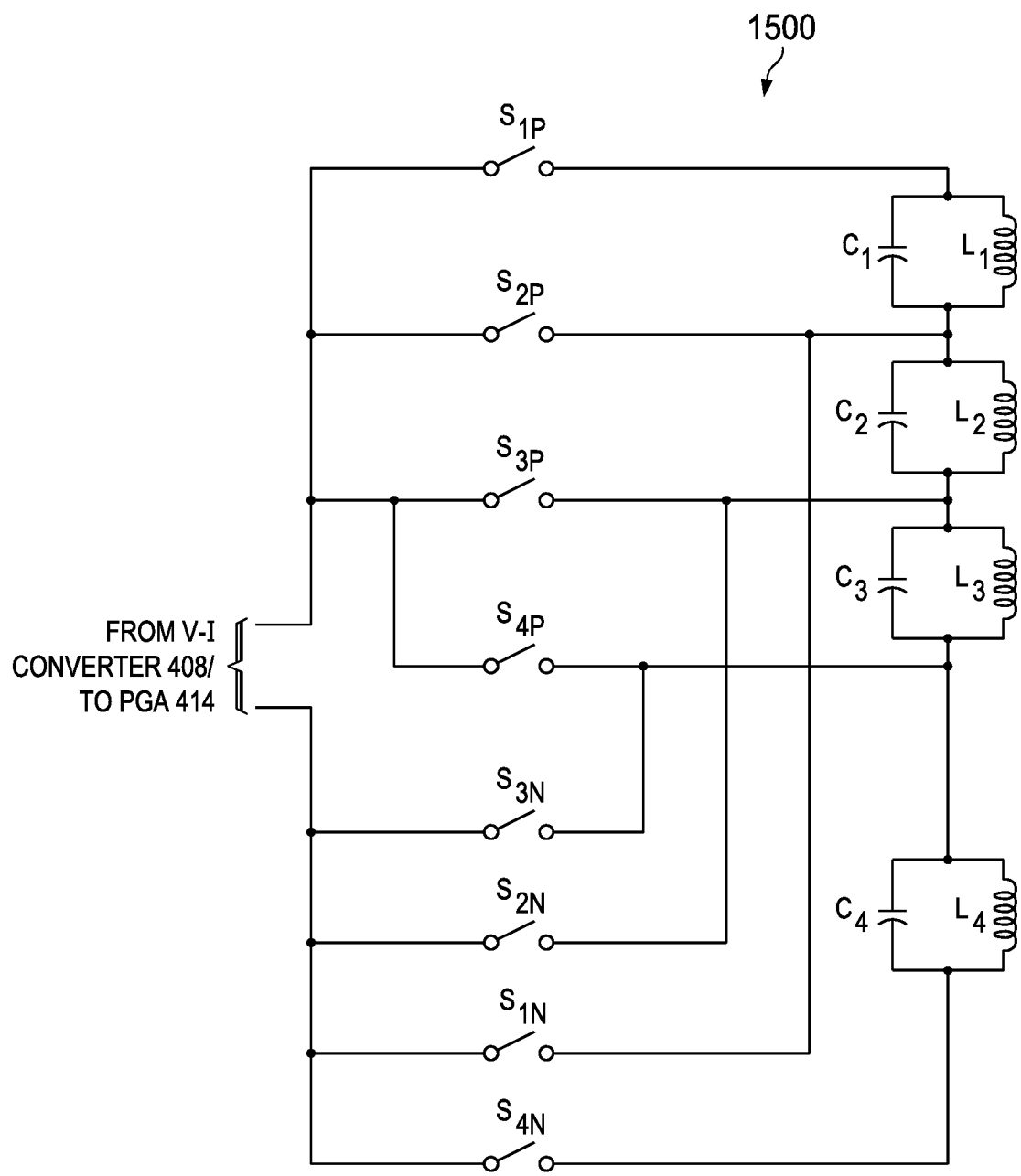

Each of FIGS. 4A-4C illustrates a diagram of selected components of an example resonant phase sensing system, in accordance with embodiments of the present disclosure;

FIG. 5 illustrates a diagram of selected components of an example resonant phase sensing system implementing time-division multiplexed processing of multiple resistive-inductive-capacitive sensors, in accordance with embodiments of the present disclosure;

FIG. 6 illustrates a diagram of selected components of an example array of resistive-inductive-capacitive sensors which may be scanned using time-division multiplexing, in accordance with embodiments of the present disclosure;

FIG. 7 illustrates a diagram of selected components of an example two-by-two array of resistive-inductive-capacitive sensors which may be scanned using time-division multiplexing, in accordance with embodiments of the present disclosure;

FIGS. 8A-8D illustrate primary paths and secondary paths for scan periods of the example two-by-two array of resistive-inductive-capacitive sensors depicted in FIG. 7, in accordance with embodiments of the present disclosure;

FIGS. 9A-9D illustrate primary paths and secondary paths for scan periods of an example two-by-two array of resistive-inductive-capacitive sensors having a single capacitor, in accordance with embodiments of the present disclosure;

FIG. 10 illustrates an example two-by-two array of resistive-inductive-capacitive sensors having a single capacitor in parallel with inductors of the array, in accordance with embodiments of the present disclosure;

FIG. 11 illustrates a flow chart of an example method for measuring sensors of an array during a measurement phase, in accordance with embodiments of the present disclosure;

FIG. 12 illustrates an example two-by-two array of resistive-inductive-capacitive sensors having a single capacitor in series with inductors of the array, in accordance with embodiments of the present disclosure;

FIG. 13 illustrates an example two-by-two array of resistive-inductive-capacitive sensors having a single capacitor C in parallel with inductors of the array and with electrical isolation of sensors from one another, in accordance with embodiments of the present disclosure;

FIG. 14 illustrates an example two-by-two array of resistive-inductive-capacitive sensors having a single capacitor C in parallel with inductors of the array, with electrical isolation of sensors from one another and a common return path for the sensors, in accordance with embodiments of the present disclosure; and FIG. 15 illustrates another example two-by-two array of resistive-inductive-capacitive sensors having a single capacitor C in parallel with inductors of the array and with electrical isolation of sensors from one another, in accordance with embodiments of the present disclosure.

DETAILED DESCRIPTION

Figure 1:
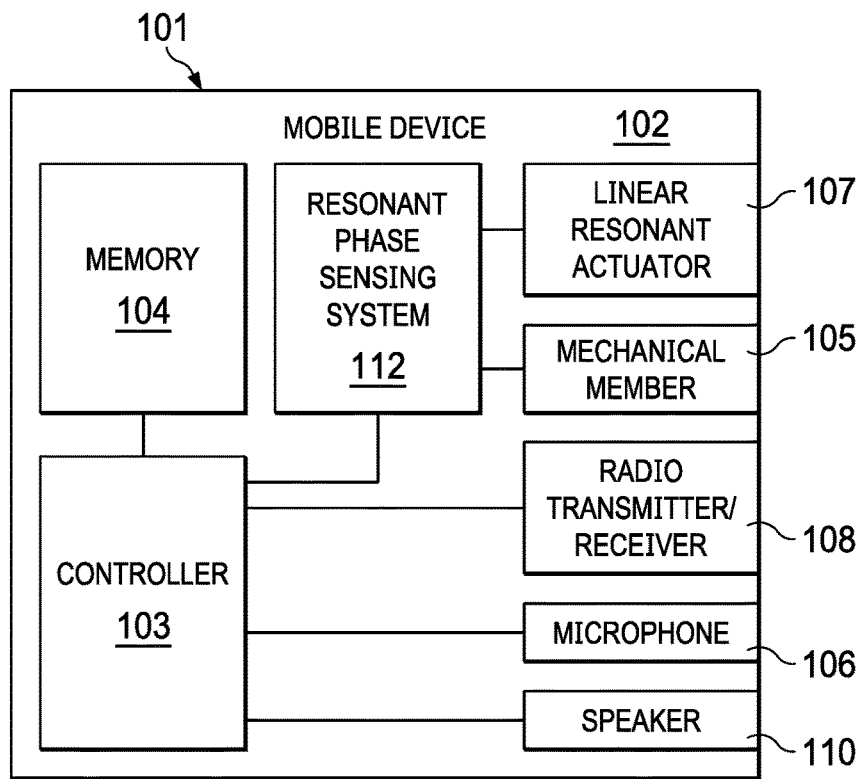
FIG. 1 illustrates a block diagram of selected components of an example mobile device, in accordance with embodiments of the present disclosure.

FIG. 1 illustrates a block diagram of selected components of an example mobile device 102, in accordance with embodiments of the present disclosure. As shown in FIG. 1, mobile device 102 may comprise an enclosure 101, a controller 103, a memory 104, a mechanical member 105, a microphone 106, a linear resonant actuator 107, a radio transmitter/receiver 108, a speaker 110, and a resonant phase sensing system 112.

Enclosure 101 may comprise any suitable housing, casing, or other enclosure for housing the various components of mobile device 102. Enclosure 101 may be constructed from plastic, metal, and/or any other suitable materials. In addition, enclosure 101 may be adapted (e.g., sized and shaped) such that mobile device 102 is readily transported on a person of a user of mobile device 102. Accordingly, mobile device 102 may include but is not limited to a smart phone, a tablet computing device, a handheld computing device, a personal digital assistant, a notebook computer, a video game controller, or any other device that may be readily transported on a person of a user of mobile device 102.

Controller 103 may be housed within enclosure 101 and may include any system, device, or apparatus configured to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, controller 103 may interpret and/or execute program instructions and/or process data stored in memory 104 and/or other computer-readable media accessible to controller 103.

Memory 104 may be housed within enclosure 101, may be communicatively coupled to controller 103, and may include any system, device, or apparatus configured to retain program instructions and/or data for a period of time (e.g., computer-readable media). Memory 104 may include random access memory (RAM), electrically erasable programmable read-only memory (EEPROM), a Personal Computer Memory Card International Association (PCMCIA) card, flash memory, magnetic storage, opto-magnetic storage, or any suitable selection and/or array of volatile or non-volatile memory that retains data after power to mobile device 102 is turned off.

Microphone 106 may be housed at least partially within enclosure 101, may be communicatively coupled to controller 103, and may comprise any system, device, or apparatus configured to convert sound incident at microphone 106 to an electrical signal that may be processed by controller 103, wherein such sound is converted to an electrical signal using a diaphragm or membrane having an electrical capacitance that varies based on sonic vibrations received at the diaphragm or membrane. Microphone 106 may include an electrostatic microphone, a condenser microphone, an electret microphone, a microelectromechanical systems (MEMS) microphone, or any other suitable capacitive microphone.

Radio transmitter/receiver 108 may be housed within enclosure 101, may be communicatively coupled to controller 103, and may include any system, device, or apparatus configured to, with the aid of an antenna, generate and transmit radio-frequency signals as well as receive radio-frequency signals and convert the information carried by such received signals into a form usable by controller 103. Radio transmitter/receiver 108 may be configured to transmit and/or receive various types of radio-frequency signals, including without limitation, cellular communications (e.g., 2G, 3G, 4G, LTE, etc.), short-range wireless communications (e.g., BLUETOOTH), commercial radio signals, television signals, satellite radio signals (e.g., GPS), Wireless Fidelity, etc.

A speaker 110 may be housed at least partially within enclosure 101 or may be external to enclosure 101, may be communicatively coupled to controller 103, and may comprise any system, device, or apparatus configured to produce sound in response to electrical audio signal input. In some embodiments, a speaker may comprise a dynamic loudspeaker, which employs a lightweight diaphragm mechanically coupled to a rigid frame via a flexible suspension that constrains a voice coil to move axially through a cylindrical magnetic gap. When an electrical signal is applied to the voice coil, a magnetic field is created by the electric current in the voice coil, making it a variable electromagnet. The voice coil and the driver's magnetic system interact, generating a mechanical force that causes the voice coil (and thus, the attached cone) to move back and forth, thereby reproducing sound under the control of the applied electrical signal coming from the amplifier.

Mechanical member 105 may be housed within or upon enclosure 101, and may include any suitable system, device, or apparatus configured such that all or a portion of mechanical member 105 displaces in position responsive to a force, a pressure, or a touch applied upon or proximately to mechanical member 105. In some embodiments, mechanical member 105 may be designed to appear as a mechanical button on the exterior of enclosure 101.

Linear resonant actuator 107 may be housed within enclosure 101, and may include any suitable system, device, or apparatus for producing an oscillating mechanical force across a single axis. For example, in some embodiments, linear resonant actuator 107 may rely on an alternating current voltage to drive a voice coil pressed against a moving mass connected to a spring. When the voice coil is driven at the resonant frequency of the spring, linear resonant actuator 107 may vibrate with a perceptible force. Thus, linear resonant actuator 107 may be useful in haptic applications within a specific frequency range. While, for the purposes of clarity and exposition, this disclosure is described in relation to the use of linear resonant actuator 107, it is understood that any other type or types of vibrational actuators (e.g., eccentric rotating mass actuators) may be used in lieu of or in addition to linear resonant actuator 107. In addition, it is also understood that actuators arranged to produce an oscillating mechanical force across multiple axes may be used in lieu of or in addition to linear resonant actuator 107. As described elsewhere in this disclosure, a linear resonant actuator 107, based on a signal received from resonant phase sensing system 112, may render haptic feedback to a user of mobile device 102 for at least one of mechanical button replacement and capacitive sensor feedback.

Together, mechanical member 105 and linear resonant actuator 107 may form a human-interface device, such as a virtual interface (e.g., a virtual button), which, to a user of mobile device 102, has a look and feel of a mechanical button or other mechanical interface of mobile device 102.

Resonant phase sensing system 112 may be housed within enclosure 101, may be communicatively coupled to mechanical member 105 and linear resonant actuator 107, and may include any system, device, or apparatus configured to detect a displacement of mechanical member 105 indicative of a physical interaction (e.g., by a user of mobile device 102) with the human-machine interface of mobile device 102 (e.g., a force applied by a human finger to a virtual interface of mobile device 102). As described in greater detail below, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105. Thus, mechanical member 105 may comprise any suitable system, device, or apparatus which all or a portion thereof may displace, and such displacement may cause a change in an impedance of a resistive-inductive-capacitive sensor integral to resonant phase sense system 112. Resonant phase sensing system 112 may also generate an electronic signal for driving linear resonant actuator 107 in response to a physical interaction associated with a human-machine interface associated with mechanical member 105. Detail of an example resonant phase sensing system 112 in accordance with embodiments of the present disclosure is depicted in greater detail below.

Although specific example components are depicted above in FIG. 1 as being integral to mobile device 102 (e.g., controller 103, memory 104, mechanical member 105, microphone 106, radio transmitter/receiver 108, speakers(s) 110, linear resonant actuator 107, etc.), a mobile device 102 in accordance with this disclosure may comprise one or more components not specifically enumerated above. For example, although FIG. 1 depicts certain user interface components, mobile device 102 may include one or more other user interface components in addition to those depicted in FIG. 1, including but not limited to a keypad, a touch screen, and a display, thus allowing a user to interact with and/or otherwise manipulate mobile device 102 and its associated components. In addition, although FIG. 1 depicts only a single virtual button comprising mechanical member 105 and linear resonant actuator 107 for purposes of clarity and exposition, in some embodiments a mobile device 102 may have multiple virtual interfaces each comprising a respective mechanical member 105 and linear resonant actuator 107.

Although, as stated above, resonant phase sensing system 112 may detect displacement of mechanical member 105 by performing resonant phase sensing of a resistive-inductive-capacitive sensor for which an impedance (e.g., inductance, capacitance, and/or resistance) of the resistive-inductive-capacitive sensor changes in response to displacement of mechanical member 105, in some embodiments resonant phase sensing system 112 may primarily detect displacement of mechanical member 105 by using resonant phase sensing to determine a change in an inductance of a resistive-inductive-capacitive sensor. For example, FIGS. 2 and 3 illustrate selected components of an example inductive sensing application that may be implemented by resonant phase sensing system 112, in accordance with embodiments of the present disclosure.

Although the foregoing contemplates a resonant phase sensing system 112 for use in a mobile device 102, the resonant phase sensing system 112 may be used in any other suitable host device. A host device may include without limitation, a portable and/or battery-powered mobile computing device (e.g., a laptop, notebook, or tablet computer), a gaming console, a remote control device, a home automation controller, a domestic appliance (e.g., domestic temperature or lighting control system), a toy, a machine (e.g., a robot), an audio player, a video player, and a mobile telephone (e.g., a smartphone).

Figure 2:
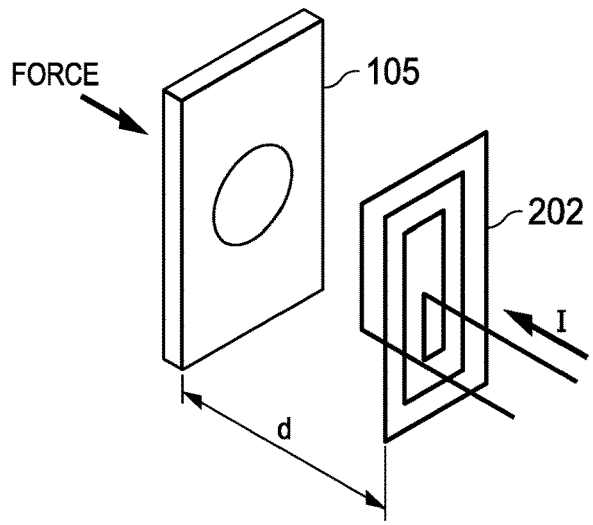
FIG. 2 illustrates a mechanical member separated by a distance from an inductive coil, in accordance with embodiments of the present disclosure.
Figure 3:
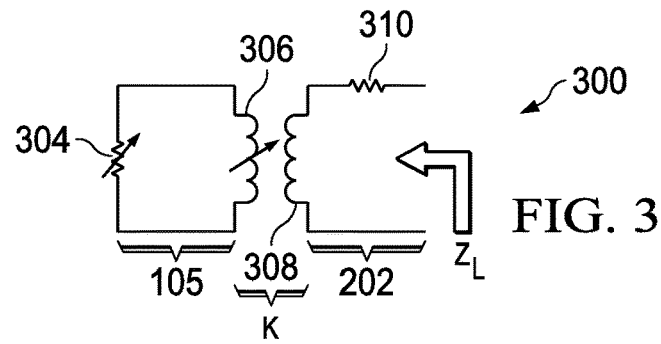
FIG. 3 illustrates selected components of a model for a mechanical member and inductive coil that may be used in an inductive sensing system, in accordance with embodiments of the present disclosure.

FIG. 2 illustrates mechanical member 105 embodied as a metal plate separated by a distance d from an inductive coil 202, in accordance with embodiments of the present disclosure. FIG. 3 illustrates selected components of a model for mechanical member 105 and inductive coil 202 that may be used in an inductive sensing system 300, in accordance with embodiments of the present disclosure. As shown in FIG. 3, inductive sensing system 300 may include mechanical member 105, modeled as a variable electrical resistance 304 and a variable electrical inductance 306, and may include inductive coil 202 in physical proximity to mechanical member 105 such that inductive coil 202 has a mutual inductance with mechanical member 105 defined by a variable coupling coefficient k. As shown in FIG. 3, inductive coil 202 may be modeled as a variable electrical inductance 308 and a variable electrical resistance 310.

In operation, as a current I flows through inductive coil 202, such current may induce a magnetic field which in turn may induce an eddy current inside mechanical member 105. When a force is applied to and/or removed from mechanical member 105, which alters distance d between mechanical member 105 and inductive coil 202, the coupling coefficient k, variable electrical resistance 304, and/or variable electrical inductance 306 may also change in response to the change in distance. These changes in the various electrical parameters may, in turn, modify an effective impedance $Z_L$ of inductive coil 202.

FIG. 4A illustrates a diagram of selected components of an example resonant phase sensing system 112A, in accordance with embodiments of the present disclosure. In some embodiments, resonant phase sensing system 112A may be used to implement resonant phase sensing system 112 of FIG. 1. As shown in FIG. 4A, resonant phase sensing system 112A may include a resistive-inductive-capacitive sensor 402 and a processing integrated circuit (IC) 412A.

As shown in FIG. 4A, resistive-inductive-capacitive sensor 402 may include mechanical member 105, inductive coil 202, a resistor 404, and capacitor 406, wherein mechanical member 105 and inductive coil 202 have a variable coupling coefficient k. Although shown in FIG. 4A to be arranged in parallel with one another, it is understood that inductive coil 202, resistor 404, and capacitor 406 may be arranged in any other suitable manner that allows resistive-inductive-capacitive sensor 402 to act as a resonant tank. For example, in some embodiments, inductive coil 202, resistor 404, and capacitor 406 may be arranged in series with one another. In some embodiments, resistor 404 may not be implemented with a stand-alone resistor, but may instead be implemented by a parasitic resistance of inductive coil 202, a parasitic resistance of capacitor 406, and/or any other suitable parasitic resistance.

Processing IC 412A may be communicatively coupled to resistive-inductive-capacitive sensor 402 and may comprise any suitable system, device, or apparatus configured to implement a measurement circuit to measure phase information associated with resistive-inductive-capacitive sensor 402 and based on the phase information, determine a displacement of mechanical member 105 relative to resistive-inductive-capacitive sensor 402. Thus, processing IC 412A may be configured to determine an occurrence of a physical interaction (e.g., press or release of a virtual button) associated with a human-machine interface associated with mechanical member 105 based on the phase information.

As shown in FIG. 4A, processing IC 412A may include a phase shifter 410, a voltage-to-current converter 408, a preamplifier 440, an intermediate frequency mixer 442, a combiner 444, a programmable gain amplifier (PGA) 414, a voltage-controlled oscillator (VCO) 416, a phase shifter 418, an amplitude and phase calculation block 431, a DSP 432, a low-pass filter 434, and a combiner 450. Processing IC 412A may also include a coherent incident/quadrature detector implemented with an incident channel comprising a mixer 420, a low-pass filter 424, and an analog-to-digital converter (ADC) 428, and a quadrature channel comprising a mixer 422, a low-pass filter 426, and an ADC 430 such that processing IC 412A is configured to measure the phase information using the coherent incident/quadrature detector.

Phase shifter 410 may include any system, device, or apparatus configured to detect an oscillation signal generated by processing IC 412A (as explained in greater detail below) and phase shift such oscillation signal (e.g., by 45 degrees) such that a normal operating frequency of resonant phase sensing system 112A, an incident component of a sensor signal ϕ generated by pre-amplifier 440 is approximately equal to a quadrature component of sensor signal ϕ, so as to provide common mode noise rejection by a phase detector implemented by processing IC 412A, as described in greater detail below.

Voltage-to-current converter 408 may receive the phase shifted oscillation signal from phase shifter 410, which may be a voltage signal, convert the voltage signal to a corresponding current signal, and drive the current signal on resistive-inductive-capacitive sensor 402 at a driving frequency with the phase-shifted oscillation signal in order to generate sensor signal ϕ which may be processed by processing IC 412A, as described in greater detail below. In some embodiments, a driving frequency of the phase-shifted oscillation signal may be selected based on a resonant frequency of resistive-inductive-capacitive sensor 402 (e.g., may be approximately equal to the resonant frequency of resistive-inductive-capacitive sensor 402).

Preamplifier 440 may receive sensor signal ϕ and condition sensor signal ϕ for frequency mixing, with mixer 442, to an intermediate frequency Δf combined by combiner 444 with an oscillation frequency generated by VCO 416, as described in greater detail below, wherein intermediate frequency Δf is significantly less than the oscillation frequency. In some embodiments, preamplifier 440, mixer 442, and combiner 444 may not be present, in which case PGA 414 may receive sensor signal ϕ directly from resistive-inductive-capacitive sensor 402. However, when present, preamplifier 440, mixer 442, and combiner 444 may allow for mixing sensor signal ϕ down to a lower intermediate frequency Δf which may allow for lower-bandwidth and more efficient ADCs (e.g., ADCs 428 and 430 of FIGS. 4A and 4B and ADC 429 of FIG. 4C, described below) and/or which may allow for minimization of phase and/or gain mismatches in the incident and quadrature paths of the phase detector of processing IC 412A.

In operation, PGA 414 may further amplify sensor signal ϕ to condition sensor signal ϕ for processing by the coherent incident/quadrature detector. VCO 416 may generate an oscillation signal to be used as a basis for the signal driven by voltage-to-current converter 408, as well as the oscillation signals used by mixers 420 and 422 to extract incident and quadrature components of amplified sensor signal ϕ. As shown in FIG. 4A, mixer 420 of the incident channel may use an unshifted version of the oscillation signal generated by VCO 416, while mixer 422 of the quadrature channel may use a 90-degree shifted version of the oscillation signal phase shifted by phase shifter 418. As mentioned above, the oscillation frequency of the oscillation signal generated by VCO 416 may be selected based on a resonant frequency of resistive-inductive-capacitive sensor 402 (e.g., may be approximately equal to the resonant frequency of resistive-inductive-capacitive sensor 402).

In the incident channel, mixer 420 may extract the incident component of amplified sensor signal ϕ, low-pass filter 424 may filter out the oscillation signal mixed with the amplified sensor signal ϕ to generate a direct current (DC) incident component, and ADC 428 may convert such DC incident component into an equivalent incident component digital signal for processing by amplitude and phase calculation block 431. Similarly, in the quadrature channel, mixer 422 may extract the quadrature component of amplified sensor signal ϕ, low-pass filter 426 may filter out the phase-shifted oscillation signal mixed with the amplified sensor signal ϕ to generate a direct current (DC) quadrature component, and ADC 430 may convert such DC quadrature component into an equivalent quadrature component digital signal for processing by amplitude and phase calculation block 431.

Amplitude and phase calculation block 431 may include any system, device, or apparatus configured to receive phase information comprising the incident component digital signal and the quadrature component digital signal and based thereon, extract amplitude and phase information.

DSP 432 may include any system, device, or apparatus configured to interpret and/or execute program instructions and/or process data. In particular, DSP 432 may receive the phase information and the amplitude information generated by amplitude and phase calculation block 431 and based thereon, determine a displacement of mechanical member 105 relative to resistive-inductive-capacitive sensor 402, which may be indicative of an occurrence of a physical interaction (e.g., press or release of a virtual button or other interaction with a virtual interface) associated with a human-machine interface associated with mechanical member 105 based on the phase information. DSP 432 may also generate an output signal indicative of the displacement. In some embodiments, such output signal may comprise a control signal for controlling mechanical vibration of linear resonant actuator 107 in response to the displacement.

The phase information generated by amplitude and phase calculation block 431 may be subtracted from a reference phase $\phi_{ref}$ by combiner 450 in order to generate an error signal that may be received by low-pass filter 434. Low-pass filter 434 may low-pass filter the error signal, and such filtered error signal may be applied to VCO 416 to modify the frequency of the oscillation signal generated by VCO 416, in order to drive sensor signal ϕ towards reference phase $\phi_{ref}$. As a result, sensor signal ϕ may comprise a transient decaying signal in response to a "press" of a virtual button (or other interaction with a virtual interface) associated with resonant phase sensing system 112A as well as another transient decaying signal in response to a subsequent "release" of the virtual button (or other interaction with a virtual interface). Accordingly, low-pass filter 434 in connection with VCO 416 may implement a feedback control loop that may track changes in operating parameters of resonant phase sensing system 112A by modifying the driving frequency of VCO 416.

FIG. 4B illustrates a diagram of selected components of an example resonant phase sensing system 112B, in accordance with embodiments of the present disclosure. In some embodiments, resonant phase sensing system 112B may be used to implement resonant phase sensing system 112 of FIG. 1. Resonant phase sensing system 112B of FIG. 4B may be, in many respects, similar to resonant phase sensing system 112A of FIG. 4A. Accordingly, only those differences between resonant phase sensing system 112B and resonant phase sensing system 112A may be described below. As shown in FIG. 4B, resonant phase sensing system 112B may include processing IC 412B in lieu of processing IC 412A. Processing IC 412B of FIG. 4B may be, in many respects, similar to processing IC 412A of FIG. 4A. Accordingly, only those differences between processing IC 412B and processing IC 412A may be described below.

Processing IC 412B may include fixed-frequency oscillator 417 and variable phase shifter 419 in lieu of VCO 416 of processing IC 412A. Thus, in operation, oscillator 417 may drive a fixed driving signal and oscillation signal which variable phase shifter 419 may phase shift to generate oscillation signals to be mixed by mixers 420 and 422. Similar to that of processing IC 412A, low-pass filter 434 may low-pass filter an error signal based on phase information extracted by amplitude and phase calculation block 431, but instead such filtered error signal may be applied to variable phase shifter 419 to modify the phase offset of the oscillation signal generated by oscillator 417, in order to drive sensor signal ϕ towards indicating a phase shift of zero. As a result, sensor signal ϕ may comprise a transient decaying signal in response to a "press" of a virtual button (or other interaction with a virtual interface) associated with resonant phase sensing system 112B as well as another transient decaying signal in response to a subsequent "release" of the virtual button (or other interaction with a virtual interface). Accordingly, low-pass filter 434 in connection with variable phase shifter 419 may implement a feedback control loop that may track changes in operating parameters of resonant phase sensing system 112B by modifying the phase shift applied by variable phase shifter 419.

FIG. 4C illustrates a diagram of selected components of an example resonant phase sensing system 112C, in accordance with embodiments of the present disclosure. In some embodiments, resonant phase sensing system 112C may be used to implement resonant phase sensing system 112 of FIG. 1. Resonant phase sensing system 112C of FIG. 4C may be, in many respects, similar to resonant phase sensing system 112A of FIG. 4A. Accordingly, only those differences between resonant phase sensing system 112C and resonant phase sensing system 112A may be described below. For example, a particular difference between resonant phase sensing system 112C and resonant phase sensing system 112A is that resonant phase sensing system 112C may include ADC 429 and ADC 431 in lieu of ADC 428 and ADC 430. Accordingly, a coherent incident/quadrature detector for resonant phase sensing system 112C may be implemented with an incident channel comprising a digital mixer 421 and a digital low-pass filter 425 (in lieu of analog mixer 420 and analog low-pass filter 424) and a quadrature channel comprising a digital mixer 423 and a low-pass filter 427 (in lieu of analog mixer 422 and analog low-pass filter 426) such that processing IC 412C is configured to measure the phase information using such coherent incident/quadrature detector. Although not explicitly shown, resonant phase sensing system 112B could be modified in a manner similar to that of how resonant phase sensing system 112A is shown to be modified to result in resonant phase sensing system 112C.

FIG. 5 illustrates a diagram of selected components of an example resonant phase sensing system 112D implementing time-division multiplexed processing of multiple resistive-inductive-capacitive sensors 402 (e.g., resistive-inductive-capacitive sensors 402A-402N shown in FIG. 5), in accordance with embodiments of the present disclosure. In some embodiments, resonant phase sensing system 112D may be used to implement resonant phase sensing system 112 of FIG. 1. Resonant phase sensing system 112D of FIG. 5 may be, in many respects, similar to resonant phase sensing system 112A of FIG. 4A. Accordingly, only those differences between resonant phase sensing system 112D and resonant phase sensing system 112A may be described below. In particular, resonant phase sensing system 112D may include a plurality of resistive-inductive-capacitive sensors 402 (e.g., resistive-inductive-capacitive sensors 402A-402N shown in FIG. 5) in lieu of the single resistive-inductive-capacitive sensor 402 shown in FIG. 4A. In addition, resonant phase sensing system 112D may include multiplexers 502 and 504, each of which may select an output signal from a plurality of input signals responsive to a control signal SELECT, which may be controlled by time-division multiplexing control circuitry 552.

Control circuit 552 may comprise any suitable system, device, or apparatus configured to control time-division multiplexed sensing on one or more resistive-inductive-capacitive sensors 402, as described in greater detail below. Although FIG. 5 shows control circuitry 552 as being integral to processing IC 412D, in some embodiments, control circuitry 552 may be implemented by controller 103 or another suitable component of mobile device 102.

Accordingly, while in some embodiments a device such as mobile device 102 may comprise a plurality of resistive-inductive-capacitive sensors 402 which may be simultaneously driven and separately processed by a respective processing IC, in other embodiments, a resonant phase sensing system (e.g., resonant phase sensing system 112D) may drive resistive-inductive-capacitive sensors 402 in a time-division multiplexed manner Such approach may reduce power consumption and device size as compared with multiple-sensor implementations in which the multiple sensors are simultaneously driven and/or sensed. Device size may be reduced by time-division multiplexing multiple sensors into a single driver and measurement circuit channel, wherein only a single driver and a single measurement circuit may be required, thus minimizing an amount of integrated circuit area needed to perform driving and measurement. In addition, by leveraging a single driver and measurement circuit, no calibration may be needed to adjust for mismatches and/or errors between different drivers and/or different measurement circuits.

For purposes of clarity and exposition, preamplifier 440, mixer 442, and combiner 444 have been excluded from FIG. 5. However, in some embodiments, processing IC 412D may include preamplifier 440, mixer 442, and combiner 444 similar to that depicted in FIGS. 4A-4C.

In resonant phase sensing system 112D, control circuitry 552 may provide control of control signal SELECT in order to, for a first duration of a scan period, select a first resistive-inductive-capacitive sensor (e.g., resistive-inductive-capacitive sensor 402A) to be driven by voltage-to-current converter 408 and measured by the measurement circuit implemented by processing IC 412D. During such first duration, control circuitry 552 may place resistive-inductive-capacitive sensors other than resistive-inductive-capacitive sensor 402A in a low-impedance state. Similarly, during a second duration of the scan period, control circuitry 552 may provide control of control signal SELECT in order to select a second resistive-inductive-capacitive sensor (e.g., resistive-inductive-capacitive sensor 402B) to be driven by voltage-to-current converter 408 and measured by the measurement circuit implemented by processing IC 412D. During such second duration, control circuitry 552 may place resistive-inductive-capacitive sensors other than resistive-inductive-capacitive sensor 402B in a low-impedance state. A similar process may allow for sensing other resistive-inductive-capacitive sensors 402 in other durations of the scan period. Such an approach may minimize power consumption within unselected resistive-inductive-capacitive sensors 402.

Although not explicitly shown, resonant phase sensing system 112B could be modified in a manner similar to that of how resonant phase sensing system 112A is shown to be modified to result in resonant phase sensing system 112D, such that resonant phase sensing system 112B could implement time-division multiplexed sensing on a plurality of resistive-inductive-capacitive sensors 402. Similarly, although not explicitly shown, resonant phase sensing system 112C could be modified in a manner similar to that of how resonant phase sensing system 112A is shown to be modified to result in resonant phase sensing system 112D, such that resonant phase sensing system 112C could implement time-division multiplexed sensing on a plurality of resistive-inductive-capacitive sensors 402.

In some instances, the resistive-inductive-capacitive sensors 402 of a multiple-sensor resonant phase sensing system such as resonant phase sensing system 112D may be implemented in a matrix array comprising N sensor rows and M sensor columns, where N and M are each integers greater than or equal to one. FIG. 6 illustrates a diagram of selected components of an example N-by-M array 600 of resistive-inductive-capacitive sensors 402 which may be scanned using time-division multiplexing, in accordance with embodiments of the present disclosure.

As depicted in FIG. 6, labels $ROW_i$ and $COL_j$ are used to designate the ith row and jth column of array 600, respectively. As shown, each inductor-capacitor pair in array 600 may correspond to a single resistive-inductive-capacitive sensor 402 with a given frequency dependent upon component values. Although not shown, the resistance of such resistive-inductive-capacitive sensor 402 may be present within parasitic resistances of sensor components. At any given time (e.g., in accordance with operation of control circuitry 552 and multiplexers 502 and 504 of resonant phase sensing system 112D), a single row and single column may be selected during which a time change in sensor parameters (e.g., phase or resonant frequency) for the resistive-inductive-capacitive sensor 402 associated with such row and column may be determined relative to such sensor parameters during a previous scan of such resistive-inductive-capacitive sensor 402. Once a scan period for a given sensor 402 is complete, the same sensor 402 may be rescanned, another sensor may be selected by modifying the selection of row and/or column, or no further action may be taken and array 600 may be disabled.

During different scan periods for sensors 402, additional equivalent paths coupled to the selected row and column during a scan may also exist. These additional equivalent paths are further illustrated with reference to FIGS. 7 and 8A-8D, below.

FIG. 7 illustrates a diagram of selected components of an example two-by-two array 700 of resistive-inductive-capacitive sensors 402 which may be scanned using time-division multiplexing, in accordance with embodiments of the present disclosure. During different respective scan periods for sensors 402, there may be multiple paths through array 700 that couple the desired row and column selection via not only the desired impedance, but also the remaining sensor array impedances. For two-by-two array 700, four different scan periods may be needed to scan the four different sensors 402, with each scan period having a primary and secondary path comprising the selected sensor 402, shown in greater detail in FIGS. 8A-8D. For purposes of clarity and exposition, the identities of sensors 402 depicted in FIG. 7 are not depicted in FIGS. 8A-8D.

Figure 8B:
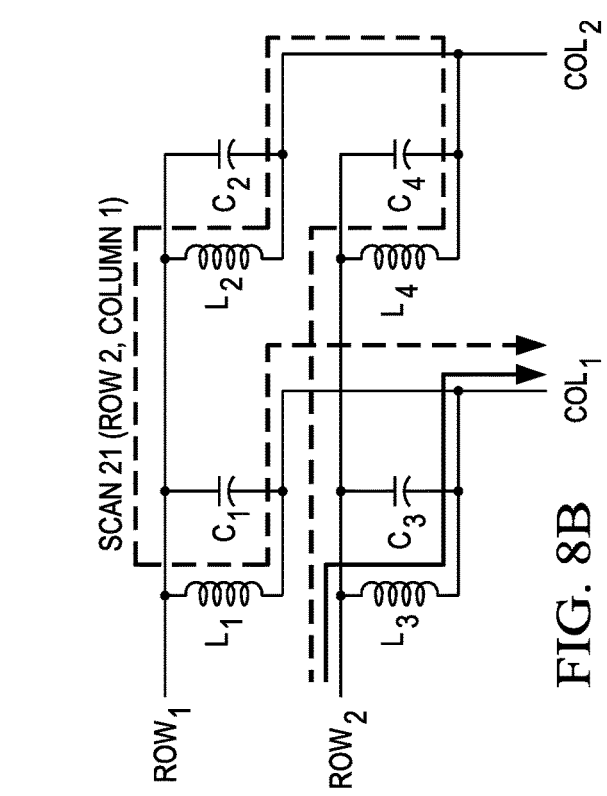
Figure 8D:
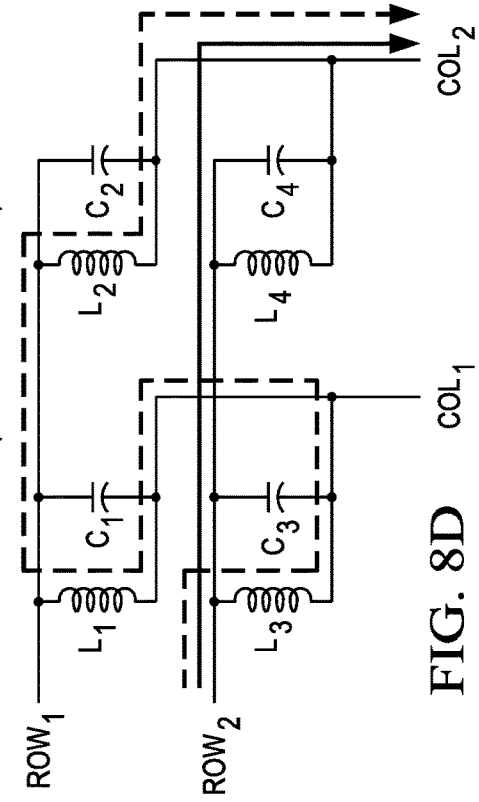
Figure 8A:
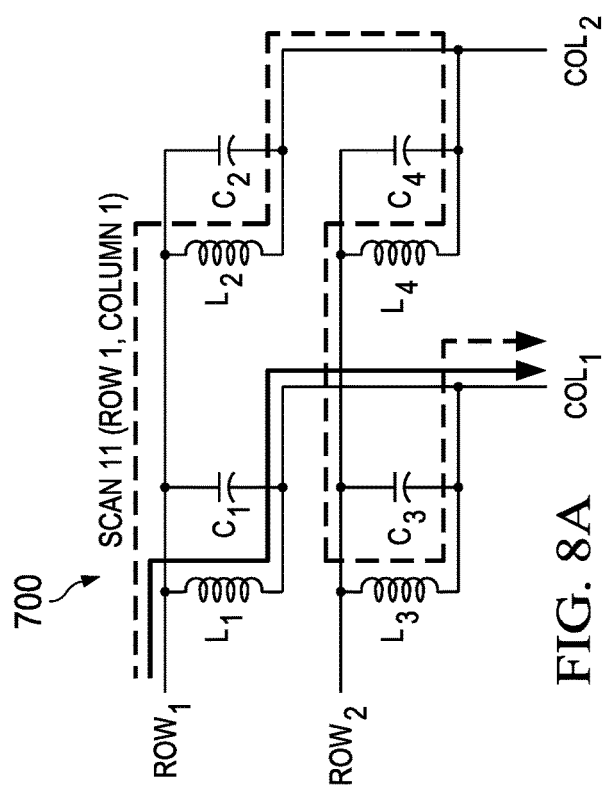
Figure 8C:
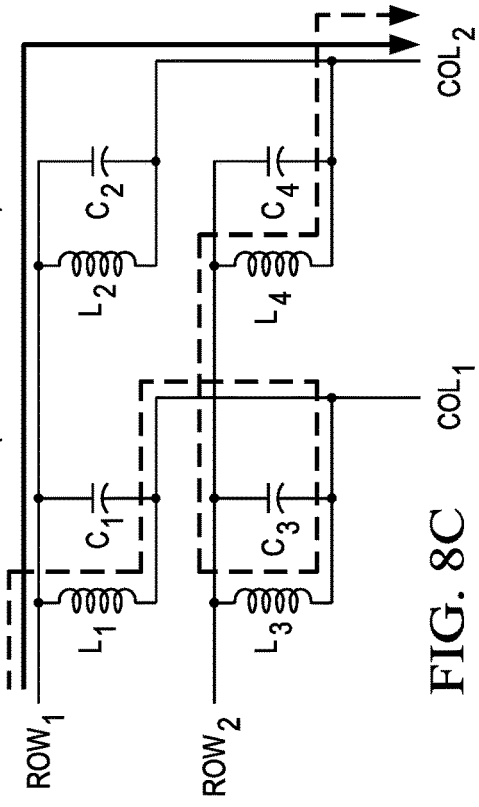
Figure 9A:
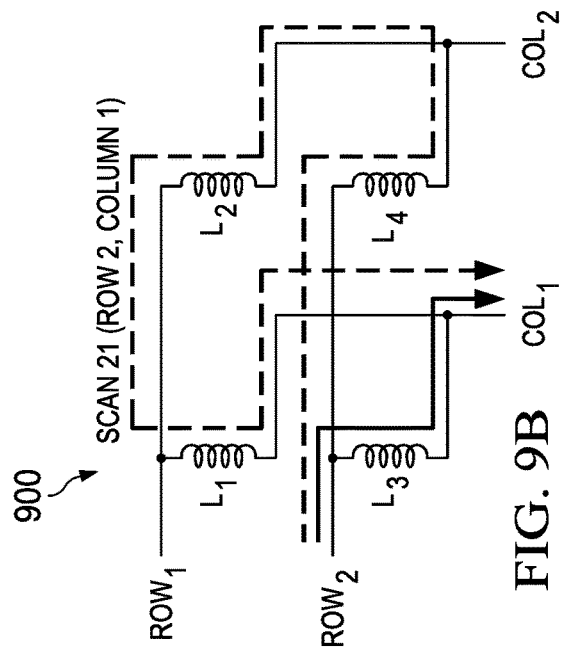
Figure 9B:
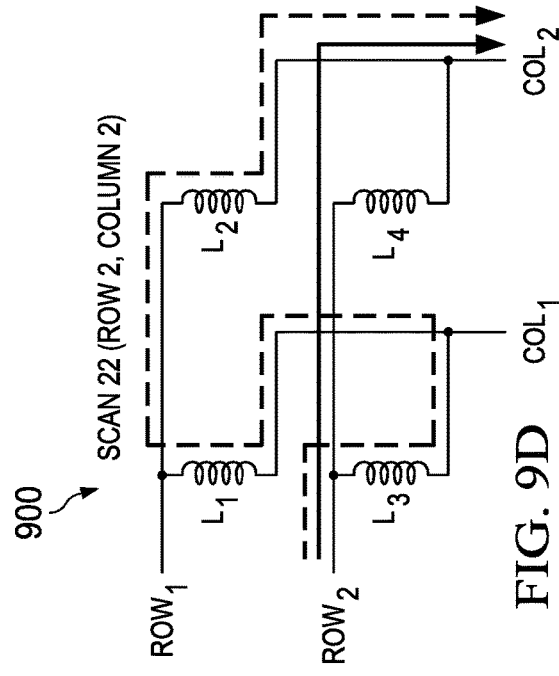
Figure 9C:
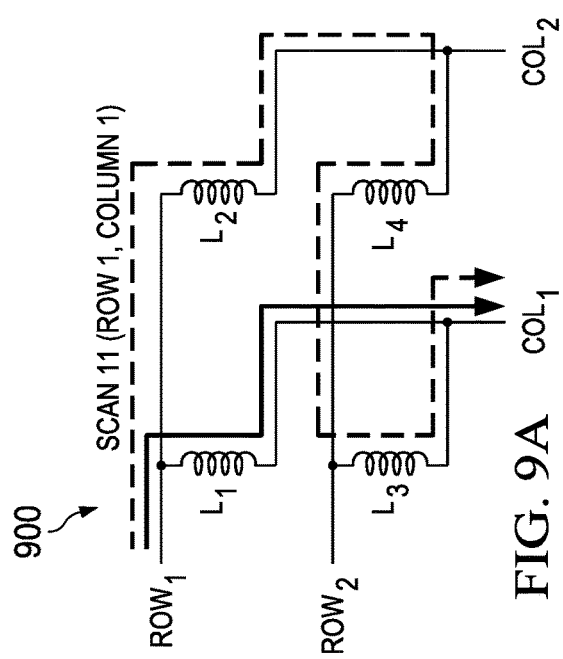
Figure 9D:
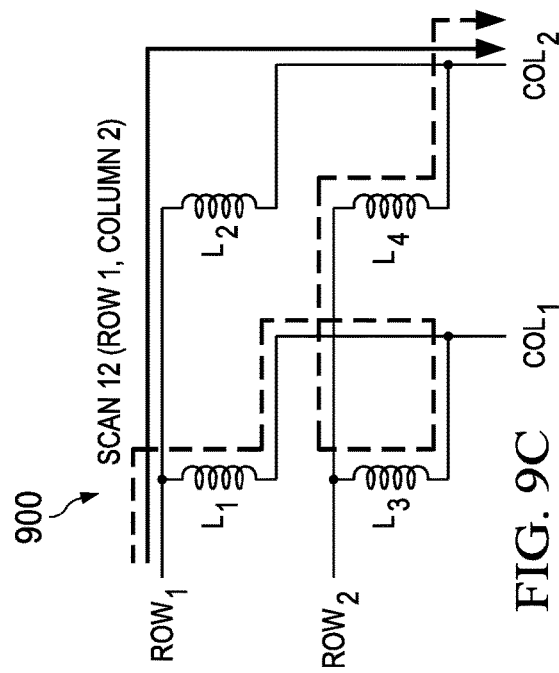

For scan period 11, $ROW_1$ and $COL_1$ are selected and the sensor 402 to be scanned comprises inductor $L_1$ and capacitor $C_1$, which appears in a primary path indicated by a solid line in FIG. 8A. However, a secondary path in parallel with the primary path may also exist, such secondary path indicated by a dashed line in FIG. 8A and comprising a series combination of the remaining sensors 402. The resulting sensor impedance $Z_{sensor,S11}$ for scan period 11 may thus be given by:

$$Z_{sensor,S11}=(Z_{L1}\|Z_{C1})\|((Z_{L2}\|Z_{C2})+(Z_{L3}\|Z_{C3})+(Z_{L4}\|Z_{C4}))$$

Due to the existence of the secondary paths in each scan period, each sensor impedance may affect the equivalent impedance in each scan period. Predicting electrical changes related to or caused by sensor impedance changes from one scan period to the next may thus become more challenging with multiple elements per sensor being associated with all scan periods. Additionally, for systems desiring a high level of integration and/or where a sensor array is large, the increased number of elements associated with the sensor system design further challenges the design.

To overcome this disadvantage, a single capacitor may be used in lieu of all of the capacitors in an array such as arrays 600 and 700 shown above, wherein such capacitor is shared by all inductors within a sensor array.

FIGS. 9A-9D illustrate primary paths and secondary paths for scan periods of an example two-by-two array 900 of resistive-inductive-capacitive sensors having a single capacitor, in accordance with embodiments of the present disclosure. The single shared capacitor is not shown in FIGS. 9A-9D, but as described elsewhere in this disclosure, may be coupled to array 900 in each scan period to provide for a primary path in parallel with a secondary path in each scan period, as indicated in FIGS. 9A-9D. in array 900, the resulting sensor impedance $Z_{sensor,S11}$ for scan period 11 may thus be given by:

$$Z_{sensor,S11}=Z_C\|(Z_{L1}\|(Z_{L2}+Z_{L3}+Z_{L4}))=Z_C\|Z_{L,eq}$$

Exercising all scan modes may provide a mechanism for determining updates to each sensor in array 900 at the scan update rate. If all sensor values in single-capacitor array 900 are equal, what results is a four-equation, four-unknown matrix which can be solved for all sensor inductances and changes related to an inductance change that may be computed:

$$\begin{bmatrix} Z_{L,eq,S11} \\ Z_{L,eq,S12} \\ Z_{L,eq,S21} \\ Z_{L,eq,S22} \end{bmatrix} = \frac{1}{\sum_{N=1}^{N=4} L_N} \times \begin{bmatrix} L_1(L_2+L_3+L_4) \\ L_2(L_1+L_3+L_4) \\ L_3(L_1+L_2+L_4) \\ L_4(L_1+L_2+L_3) \end{bmatrix}$$

FIG. 10 illustrates an example two-by-two array 1000 of resistive-inductive-capacitive sensors 402 having a single capacitor C in parallel with inductors of array 1000, in accordance with embodiments of the present disclosure. As shown in FIG. 10, array 1000 may be coupled to voltage-to-current converter 408 or another driver configured to drive a current $I_{DRIVE}$ at or near the resonant frequency of a sensor into a selected row and column of array 1000 based on control switches labeled $ROW_1$, $ROW_2$, $COL_1$, and $COL_2$, wherein such control switches may effectively implement all or a part of multiplexers 502 and 504 shown in FIG. 5. Such current may cause a differential voltage $V_{OUT}$ to be generated that is a function of current $I_{DRIVE}$, capacitance of shared capacitor C, and effective inductance associated with the selected column and row, as described above.

The control switches and/or shared capacitor C may be implemented on an integrated circuit (e.g., within a processing IC 412) or as standard printed circuit board components depending on system use case, overall desired power consumption, and/or characteristics of desired operations for the sensors embodied by array 1000.

In some embodiments, a fifth scan period may be employed (e.g., by leaving open all control switches) as a calibration period to determine a capacitance of shared capacitor C to aid in calculations associated with a selected sensor scan.

FIG. 11 illustrates a flow chart of an example method 1100 for measuring sensors of an array during a measurement phase, in accordance with embodiments of the present disclosure. According to certain embodiments, method 1100 may begin at step 1102. As noted above, teachings of the present disclosure may be implemented in a variety of configurations of resonance phase sensing system 112. As such, the preferred initialization point for method 1100 and the order of the steps comprising method 1100 may depend on the implementation chosen. In these and other embodiments, method 1100 may be implemented as firmware, software, applications, functions, libraries, or other instructions.

At step 1102, a measurement phase may begin with VCO 416 driving a known frequency waveform into voltage-to-current converter 408. At step 1104, in response, voltage-to-current converter 408 may drive a current $I_{DRIVE}$ to array 1000, wherein such current $I_{DRIVE}$ comprises a waveform which is a function of the frequency waveform driven by VCO 416. At step 1106, a calibration phase may be initiated to determine a capacitance of shared capacitor C relative to a reference measurement, which may be stored for later processing. At step 1108, for each desired row and column, control switches may be appropriately activated and deactivated, generating voltage $V_{OUT}$, which may then be processed by processing IC 412 as described elsewhere herein to determine parameters of the sensors embodied by array 1000. At step 1110, the processed output may be used to determine if any sensor implemented by array 1000 has changed over time. For example, in example two-by-two array 1000, processing of processing IC 412 may invert a matrix obtained from measurements of voltage $V_{OUT}$ with known current IDRIVE and solve for sensor component values, such as given by:

$$\begin{bmatrix} V_{S11} \\ V_{S12} \\ V_{S21} \\ V_{S22} \end{bmatrix} = I_{driver} \times \begin{bmatrix} Z_C \| Z_{L,eq,S11} \\ Z_C \| Z_{L,eq,S12} \\ Z_C \| Z_{L,eq,S21} \\ Z_C \| Z_{L,eq,S22} \end{bmatrix}$$

Although FIG. 11 discloses a particular number of steps to be taken with respect to method 1100, method 1100 may be executed with greater or fewer steps than those depicted in FIG. 11. In addition, although FIG. 11 discloses a certain order of steps to be taken with respect to method 1100, the steps comprising method 1100 may be completed in any suitable order.

Method 1100 may be implemented using a resonance phase sensing system 112, components thereof or any other system operable to implement method 1100. In certain embodiments, method 1100 may be implemented partially or fully in software and/or firmware embodied in computer-readable media.

Although FIG. 10 depicts array 1000 implemented with an array of inductors in parallel with shared capacitor C, in some embodiments, shared capacitor C may be in series with inductors of an array. For example, FIG. 12 illustrates an example two-by-two array 1200 of resistive-inductive-capacitive sensors having a single capacitor C in series with inductors of array 1200, in accordance with embodiments of the present disclosure.

In the embodiments of sensor arrays described above, each scan period may have an effective impedance defined by a primary path in parallel with a secondary path. However, to reduce effects of other sensors on a particular sensor during a scan period, a single-capacitor sensor system may have a direct-drive architecture to isolate each sensor from the other sensors in an array. To that end, FIG. 13 illustrates an example two-by-two array 1300 of resistive-inductive-capacitive sensors having a single capacitor C in parallel with inductors of array 1300 and with electrical isolation of sensors from one another, in accordance with embodiments of the present disclosure. In array 1300, additional paths may be implemented using additional control switches and isolation circuitry in order to isolate each sensor from the other sensors of array 1300. While FIG. 13 shows an architecture having a single current driver, some embodiments may include multiple drivers which may be implemented in any combination between one driver per sensor and one driver for all sensors, while still employing only a single shared capacitor C. In addition, in some embodiments, array 1300 as shown in FIG. 13 may provide for shared capacitor C to be in series with inductors of array 1300, in a manner similar to array 1200 of FIG. 12.

While FIG. 13 depicts array 1300 as having isolated return paths for each sensor, in some embodiments, sensors may have a common return path. To that end, FIG. 14 illustrates an example two-by-two array 1400 of resistive-inductive-capacitive sensors having a single capacitor C in parallel with inductors of array 1400, with electrical isolation of sensors from one another and a common return path for the sensors, in accordance with embodiments of the present disclosure. In the embodiments represented by array 1400, one end of the sensors may be driven while the other end of the sensors may be coupled to a common impedance. In some embodiments, the common return of the sensors may be held at a ground (e.g., a board or signal ground) while being driven in a single-ended manner.

Although shown to have control switches on the common return path, in some embodiments array 1400 may not include some or all of these return control switches, and any combination between 0 and N return control switches (where N is the number of sensors) may be used. One terminal of the sensor driver may be driven with a current or a voltage as desired while still sensing the individual sensor voltages and performing calculations to determine the sensor component values and their changes during successive or long-term scan periods. While FIG. 14 shows an architecture having a single current driver, some embodiments may include multiple drivers which may be implemented in any combination between one driver per sensor and one driver for all sensors, while still employing only a single shared capacitor C. In addition, in some embodiments, array 1400 as shown in FIG. 14 provides for shared capacitor C to be in series with inductors of array 1400, in a manner similar to array 1200 of FIG. 12.

FIG. 15 illustrates another example two-by-two array 1500 of resistive-inductive-capacitive sensors having a single capacitor C in parallel with inductors of the array 1500 and with electrical isolation of sensors from one another, in accordance with embodiments of the present disclosure. In general, in array 1500, each sensor may be coupled to either output terminal of a driver. Accordingly, when one sensor is enabled, the others may not affect sensor measurement and no secondary paths exist within array 1500. Multiple columns may be constructed in the manner shown in FIG. 15 to create a matrix. For example, if there are 'n' sensors in each column, 2n control switches and n+1 control pins may be required.

Although the foregoing contemplates implementing multiple sensors in an array using a plurality of time-division multiplexed inductors and a single capacitor in series or parallel with the inductors, such that a change in inductances of the individual sensors is used as a basis for sensor measurement, the foregoing systems and methods may also be applied to the inductive-capacitive duals of the various arrays discussed above, such that multiple sensors are implemented in an array using a plurality of time-division multiplexed capacitors and a single inductor in series or parallel with the capacitors, such that a change in capacitances of the individual sensors is used as a basis for sensor measurement.

Although the foregoing contemplates use of closed-loop feedback for sensing of displacement, the various embodiments represented by FIGS. 4A-15 may be modified to implement an open-loop system for sensing of displacement. In such an open-loop system, a processing IC may include no feedback path from amplitude and phase calculation block 431 to VCO 416 or variable phase shifter 419 and thus may also lack a feedback low-pass filter 434. Thus, a phase measurement may still be made by comparing a change in phase to a reference phase value, but the oscillation frequency driven by VCO 416 may not be modified or the phase shifted by variable phase shifter 419 may not be shifted.

Although the foregoing contemplates use of a coherent incident/quadrature detector as a phase detector for determining phase information associated with resistive-inductive-capacitive sensor 402, a resonant phase sensing system 112 may perform phase detection and/or otherwise determine phase information associated with resistive-inductive-capacitive sensor 402 in any suitable manner, including, without limitation, using only one of the incident path or quadrature path to determine phase information.

In some embodiments, an incident/quadrature detector as disclosed herein may include one or more frequency translation stages that translate the sensor signal into direct-current signal directly or into an intermediate frequency signal and then into a direct-current signal. Any of such frequency translation stages may be implemented either digitally after an analog-to-digital converter stage or in analog before an analog-to-digital converter stage.

In addition, although the foregoing contemplates measuring changes in resistance and inductance in resistive-inductive-capacitive sensor 402 caused by displacement of mechanical member 105, other embodiments may operate based on a principle that any change in impedance based on displacement of mechanical member 105 may be used to sense displacement. For example, in some embodiments, displacement of mechanical member 105 may cause a change in a capacitance of resistive-inductive-capacitive sensor 402, such as if mechanical member 105 included a metal plate implementing one of the capacitive plates of capacitor 406.

Although DSP 432 may be capable of processing phase information to make a binary determination of whether physical interaction associated with a human-machine interface associated with mechanical member 105 has occurred and/or ceased to occur, in some embodiments, DSP 432 may quantify a duration of a displacement of mechanical member 105 to more than one detection threshold, for example to detect different types of physical interactions (e.g., a short press of a virtual button versus a long press of the virtual button). In these and other embodiments, DSP 432 may quantify a magnitude of the displacement to more than one detection threshold, for example to detect different types of physical interactions (e.g., a light press of a virtual button versus a quick and hard press of the virtual button).

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
    an array of sensor elements, the array of sensor elements each comprising a first type of passive reactive element;
    a second type of passive reactive element electrically coupled to the array of sensor elements;
    a driver configured to drive the array of sensor elements and the second type of passive reactive element; and
    control circuitry configured to control enabling and disabling of individual sensor elements of the array of sensor elements such that when one of the array of sensor elements is enabled, the one of the array of sensor elements and the second type of passive reactive element together operate as a resonant sensor.

2. The system of claim 1, wherein the first type of passive reactive element is an inductor and the second type of passive reactive element is a capacitor.

3. The system of claim 1, wherein the first type of passive reactive element is a capacitor and the second type of passive reactive element is an inductor.

4. The system of claim 1, further comprising a measurement circuit communicatively coupled to the array of sensor elements and configured to measure information associated with the resonant sensor implemented by the one of the array of sensor elements and the second type of passive reactive element.

5. The system of claim 4, wherein the measurement circuit is further configured to, based on the information, determine a displacement of a mechanical member relative to the resonant sensor, wherein the displacement of the mechanical member causes a change in an impedance of the resonant sensor.

6. The system of claim 4, wherein the information comprises at least one of phase information, amplitude information, and resonant frequency information associated with the resonant sensor.

7. The system of claim 1, wherein the control circuitry is configured to control the array of sensor elements, such that when one of the array of sensor elements is enabled, the one of the array of sensor elements is isolated from the others of the array of sensor elements.

8. The system of claim 7, wherein each of the array of sensor elements has a common return path.

9. The system of claim 1, wherein the control circuitry is configured to control the array of sensor elements, such that when one of the array of sensor elements is enabled, the one of the array of sensor elements is in parallel with a series combination of the others of the array of sensor elements.

10. The system of claim 1, wherein the control circuitry is further configured to control enabling and disabling of individual sensor elements of the array of sensor elements to ensure no more than one of the array of sensor elements is enabled at a time.

11. The system of claim 1, wherein the control circuitry is further configured to control enabling and disabling of individual sensor elements of the array of sensor elements to ensure that adjacent sensor elements of the array of sensor elements are not enabled at the same time.

12. A method comprising:
    driving an array of sensor elements, the array of sensor elements each comprising a first type of passive reactive element;

driving a second type of passive reactive element electrically coupled to the array of sensor elements; and controlling enabling and disabling of individual sensor elements of the array of sensor elements such that when one of the array of sensor elements is enabled, the one of the array of sensor elements and the second type of passive reactive element together operate as a resonant sensor.

13. The method of claim 12, wherein the first type of passive reactive element is an inductor and the second type of passive reactive element is a capacitor.

14. The method of claim 12, wherein the first type of passive reactive element is a capacitor and the second type of passive reactive element is an inductor.

15. The method of claim 12, further comprising measuring information associated with the resonant sensor implemented by the one of the array of sensor elements and the second type of passive reactive element.

16. The method of claim 15, further comprising, based on the information, determining a displacement of a mechanical member relative to the resonant sensor, wherein the displacement of the mechanical member causes a change in an impedance of the resonant sensor.

17. The method of claim 15, wherein the information comprises at least one of phase information, amplitude information, and resonant frequency information associated with the resonant sensor.

18. The method of claim 12, further comprising controlling the array of sensor elements, such that when one of the array of sensor elements is enabled, the one of the array of sensor elements is isolated from the others of the array of sensor elements.

19. The method of claim 18, wherein each of the array of sensor elements has a common return path.

20. The method of claim 12, further comprising controlling the array of sensor elements, such that when one of the array of sensor elements is enabled, the one of the array of sensor elements is in parallel with a series combination of the others of the array of sensor elements.

21. The method of claim 12, further comprising controlling enabling and disabling of individual sensor elements of the array of sensor elements to ensure no more than one of the array of sensor elements is enabled at a time.

22. The method of claim 12, further comprising controlling enabling and disabling of individual sensor elements of the array of sensor elements to ensure that adjacent sensor elements of the array of sensor elements are not enabled at the same time.

* * * * *